(12) United States Patent
Yaung et al.

(10) Patent No.: US 7,203,074 B1
(45) Date of Patent: Apr. 10, 2007

(54) ELECTRONIC CIRCUIT BUILDING BLOCK

(75) Inventors: Andrew Yaung, Fremont, CA (US); Neal S. Greenberg, Fremont, CA (US); Che Wai Yeung, Milpitas, CA (US)

(73) Assignee: Intellect Lab, LLC, Fremont, CA (US)

( * ) Notice: Subject to any disclaimer, the term of this patent is extended or adjusted under 35 U.S.C. 154(b) by 442 days.

(21) Appl. No.: 10/738,405

(22) Filed: Dec. 16, 2003

Related U.S. Application Data

(60) Provisional application No. 60/490,713, filed on Jul. 28, 2003.

(51) Int. Cl.
*H05K 1/14* (2006.01)

(52) U.S. Cl. .............. 361/784; 361/740; 361/785; 361/803; 439/65; 29/830

(58) Field of Classification Search .............. None
See application file for complete search history.

(56) References Cited

U.S. PATENT DOCUMENTS

| | | | |
|---|---|---|---|
| 3,998,045 A | 12/1976 | Lester | |
| 4,523,796 A * | 6/1985 | Rank | 439/65 |
| 4,524,240 A | 6/1985 | Stock et al. | |
| 4,643,501 A | 2/1987 | Coffin | |
| 4,761,881 A * | 8/1988 | Bora et al. | 29/840 |
| 4,772,864 A | 9/1988 | Otto et al. | |
| 4,812,754 A | 3/1989 | Tracy et al. | |
| 4,835,704 A | 5/1989 | Eichelberger et al. | |
| 4,866,508 A | 9/1989 | Eichelberger et al. | |
| 5,014,163 A * | 5/1991 | Lin | 361/796 |
| 5,080,539 A | 1/1992 | Stormer | |
| 5,099,090 A | 3/1992 | Allan et al. | |
| 5,110,298 A * | 5/1992 | Dorinski et al. | 439/65 |
| 5,156,772 A | 10/1992 | Allan et al. | |
| 5,159,536 A | 10/1992 | Silverio | |
| 5,214,655 A | 5/1993 | Eichelberger et al. | |
| 5,341,142 A | 8/1994 | Reis et al. | |
| 5,834,843 A * | 11/1998 | Mori et al. | 257/723 |
| 6,068,518 A * | 5/2000 | McEuen | 439/660 |
| 6,343,940 B1* | 2/2002 | Khoury et al. | 439/66 |
| 6,369,445 B1* | 4/2002 | Khoury | 257/730 |
| 6,467,163 B1 | 10/2002 | Laschinski | |
| 6,512,293 B1* | 1/2003 | Chia et al. | 257/730 |

(Continued)

FOREIGN PATENT DOCUMENTS

GB          2123621 A   *   2/1984

(Continued)

*Primary Examiner*—John B. Vigushin
(74) *Attorney, Agent, or Firm*—Schneck & Schneck; Thomas Schneck; David M. Schneck

(57) ABSTRACT

Electronic Circuit Building Blocks are mechanically connected to each other to form larger circuit boards using a mechanical bridge connector. The Electronic Circuit Building Blocks include female interlocking elements formed on its edges, and the mechanical bridge connector includes male interlocking elements. Half parts of the male interlocking elements of the mechanical bridge connector are inserted into the corresponding female interlocking elements of the Electronic Circuit Building Blocks from one side of the circuit board. The Electronic Circuit Building Blocks include through-holes for mounting through-hole components and/or surface-mount pads for mounting surface-mount components. The Electronic Circuit Building Blocks also include traces interconnecting two or more of the through-hole components and the surface-mount components.

20 Claims, 14 Drawing Sheets

U.S. PATENT DOCUMENTS

| | | |
|---|---|---|
| 6,650,548 B1 | 11/2003 | Swetland |
| 6,801,436 B2 * | 10/2004 | Pearson et al. ............. 361/759 |
| 2002/0080590 A1 * | 6/2002 | Bauermeister ............. 361/803 |
| 2004/0066642 A1 | 4/2004 | Swetland |
| 2004/0099439 A1 | 5/2004 | Swetland |

FOREIGN PATENT DOCUMENTS

| | | |
|---|---|---|
| WO | WO 03/105109 A1 | 12/2003 |

* cited by examiner

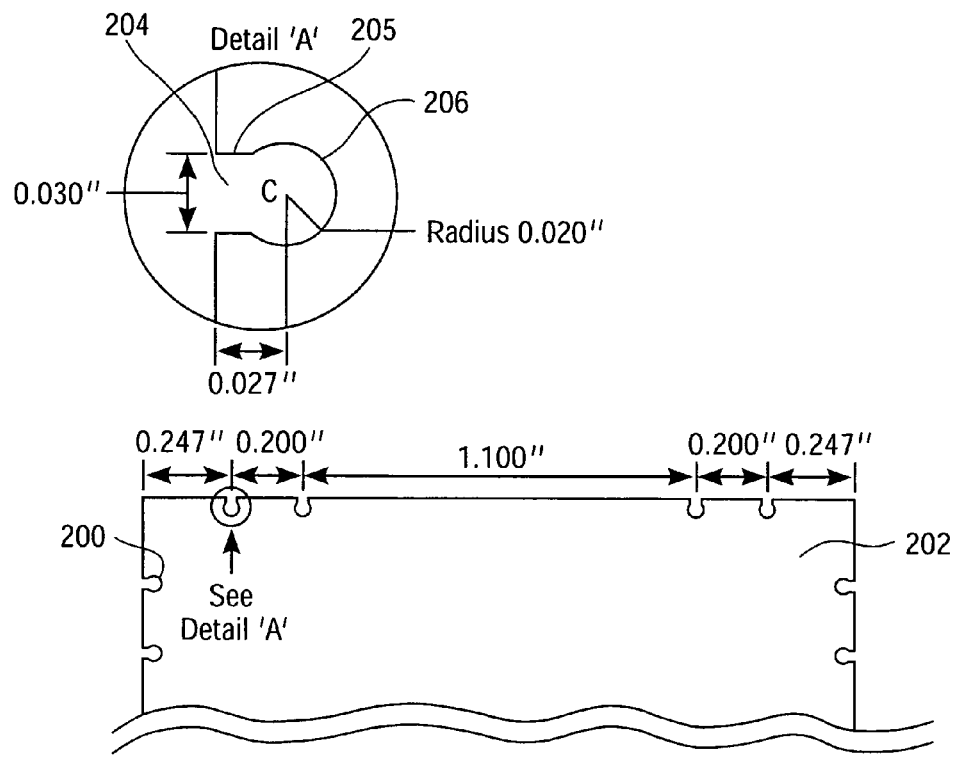
FIG. 2
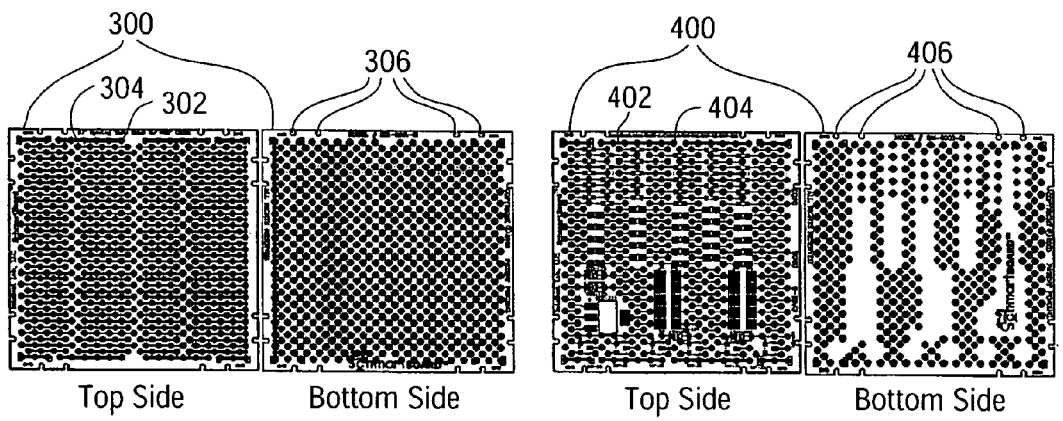
Top Side        Bottom Side
T.H. 0.1" Spacing With 0.05" Offset,
2" X 2" Grid
FIG. 3
Top Side        Bottom Side
0603/0805/1206/Case-A/Case-B/SOD-123
SOT-23/SOT-223 2" X 2" Grid
FIG. 4

Top Side | Bottom Side
SO, 4 - 56 Pins, 2" X 2" Grid

Top Side | Bottom Side
SOP, 4 - 72 Pins 0.8mm Pitch, 2" X 2" Grid

Top Side | Bottom Side
SOP, 4 - 72 Pins 0.65mm Pitch, 2" X 2" Grid

Top Side | Bottom Side
SOP, 4 - 72 Pins 0.5mm Pitch, 2" X 2" Grid

SOP, 4 - 72 Pins 0.4mm Pitch,
2" X 2" Grid

QFP, 32 - 64 Pins 0.8mm Pitch,
2" X 2" Grid

QFP, 100 Pins 0.65mm Pitch,
2" X 2" Grid

QFP, 32 - 100 Pins 0.5mm Pitch,
2" X 2" Grid

PLCC, 20 - 84 Pins 0.05" Pitch,
2" X 2" Grid

T.H. Power and GND Strip
0.5" X 2" Grid

T.H. Drive Power Conn and Power Jack
0.5" X 2" Grid

T.H. ATX Power Connector
0.5" X 2" Grid

T.H. Audio/RCA Jack
0.5" X 2" Grid

T.H. DB 25 Connector
0.5" X 2" Grid

T.H. JTAG 20 Pins 0.1" SP and IEEE1394
0.5" X 2" Grid

T.H. RGB 15 Pins Connector
0.5" X 2" Grid

Top Side — Bottom Side
T.H. Switches T.H.
0.5" X 2" Grid

Top Side — Bottom Side
T.H. RJ11/45 and USB Connector
0.5" X 2" Grid

ELECTRONIC CIRCUIT BUILDING BLOCK

CROSS-REFERENCE TO RELATED APPLICATION

This application claims priority under 35 U.S.C. §119(e) to co-pending U.S. Provisional Patent Application No. 60/490,713 entitled "Electronic Circuit Building Block," filed on Jul. 28, 2003, the subject matter of which is incorporated by reference herein in its entirety.

TECHNICAL FIELD

The present invention relates generally to electronic circuits, and more specifically, to electronic circuit boards that allow grouping and separation of various circuits in different board designs and connection of the separate boards to form a larger electronic circuit board.

BACKGROUND OF THE INVENTION

Design of electronic circuits typically involves creating a functional prototype circuit. In order to create a functional prototype circuit, a layout of a printed circuit board (PCB) for the prototype is first created and then the PCB for the prototype circuit is fabricated and assembled with the electronic components for the prototype circuit. The prototype circuit on the PCB is tested and also modified where required, for example, to comply with FCC (Federal Communications Commission) regulations and other regulations in addition to correcting the functionalities of the electronic circuit. Small changes to the prototype circuit require fabricating of another PCB again and repetition of this process over and over. Sometimes this PCB fabrication process will be repeated numerous times before an acceptable prototype is attained, thus making the creation of a prototype circuit an extremely time-consuming and costly process.

Due to the time and cost involved with creating PCB boards, conventional so-called "breadboards" or conventional wire-wrap boards are frequently used to implement an initial prototype board of the electronic circuitry so that the functionalities of the electronic circuitry can be ascertained prior to embarking on the lengthy and costly process of creating a prototype on PCB. However, these conventional wire-wrap boards and breadboards also have significant disadvantages.

For example, conventional wire-wrap boards and breadboards are not inter-connectable, scalable, or customizable, and thus cannot be expanded in a convenient manner. Therefore, the entire prototype circuitry is commonly required to be placed on one wire-wrap board or on one breadboard. Even if only a part of the prototype circuitry is defective, the entire prototype circuitry must be implemented again on a new wire-wrap board or breadboard because the wire-wrap board or the breadboard is not modular.

Furthermore, conventional wire-wrap boards or breadboards are not designed for mounting surface-mount components and do not have pre-designed component footprints or bus interfaces thereon. Thus, the surface-mount components require adapters to be mounted on wire-wrap boards or breadboards, and extensive wiring or soldering is required for interconnecting the various components of the prototype electronic circuit on a wire-wrap board or breadboard. Therefore, it is very time-consuming and cumbersome to implement a prototype electronic circuit using a conventional wire-wrap board or breadboard.

In addition, conventional wire-wrap boards or breadboards are not capable of separating parts of the circuit for enhancement of Electromagnetic Interference (EMI) characteristics and Radio Frequency Interference (RFI) characteristics. It is considered a good design practice to group electronic components by both function and speed to avoid potential EMI and RFI problems. For example, most electronic devices have both analog and digital circuitry and use separate board areas for the digital and analog circuitry, since analog circuits are generally more sensitive to digital noise. When separating the analog and digital circuitry, the prototype circuit board is commonly designed with respective circuit traces of the digital and analog circuitry in their respective appropriate parts of the board, and the analog and digital power and ground planes are not overlapped with each other. However, since the conventional wire-wrap boards or breadboards are not modular and thus cannot be separated to several modules, it is difficult to implement such separation of circuitry to avoid potential EMI and RFI problems with the conventional wire-wrap boards or breadboards.

Therefore, there is need for a circuit board or an electronic circuit building block that is modular and capable of being connected to each other. There is also a need for an electronic circuit building block that is mechanically rigid when connected to another electronic circuit building block, so that the connected electronic circuit building blocks may be used in actual electronics products. There is also a need for an electronic circuit building block on which various types of electronic components such as surface-mount components and through-hole components may be mounted and interconnected in a convenient manner. There is also a need for an electronic circuit building block that can be used to separate certain parts of the prototype circuitry to avoid potential EMI and RFI problems. There is also a need for an electronic circuit building block that can be used to create electronic circuit prototypes in a short amount of time and with low cost.

SUMMARY OF INVENTION

The present invention provides circuit boards (Electronic Circuit Building Blocks) that can be mechanically connected to each other using a mechanical bridge connector to form larger circuit boards. The Electronic Circuit Building Blocks include female interlocking elements formed on its edges, and the mechanical bridge connector includes male interlocking elements. Half parts of the male interlocking elements of the mechanical bridge connector are inserted into the corresponding female interlocking elements of the Electronic Circuit Building Blocks from one side of the circuit board.

The Electronic Circuit Building Blocks include through-holes for mounting through-hole components and/or surface-mount pads for mounting surface-mount components. The Electronic Circuit Building Blocks also include traces interconnecting two or more of the through-hole components and the surface-mount components mounted on the Electronic Circuit Building Blocks.

The Electronic Circuit Building Blocks provide a convenient and inexpensive way to build prototype circuit boards as well as circuit boards for final products. Circuit components may be mounted on a plurality of Electronic Circuit Building Blocks which then can be interconnected using the mechanical bridge connectors, disconnected if necessary, reconnected again using the mechanical bridge connectors. A prototype circuit board may be built in a shorter amount of time at a lower cost than required for building prototype circuits using conventional breadboards, conventional wire-wrap boards, or conventional printed circuit boards. Since component footprints and pre-traced wires are already present in the Electronic Circuit Building Blocks, it takes significantly less jumper wires, time, and effort to interconnect the components on the prototype circuits. The Electronic Circuit Building Blocks are scalable using the mechanical bridge connectors and thus allow creation of a circuit board of any size and functionality.

The Electronic Circuits Building Blocks are suitable for volume production, since they can be manufactured using standard processes for manufacturing conventional printed circuit boards. The Electronic Circuit Building Blocks also allow for grouping and separation of various types of circuits with different functionalities.

BRIEF DESCRIPTION OF THE DRAWINGS

FIG. 2 is a diagram illustrating a female interlocking element (slot) of an Electronic Circuit Building Block according to one embodiment of the present invention.

FIG. 3 is a diagram illustrating an Electronic Circuit Building Block with pre-routed traces and pre-configured to hold through-hole components, according to one embodiment of the present invention.

FIG. 4 is a diagram illustrating an Electronic Circuit Building Block with pre-routed traces and pre-configured to hold 0603/0805/1206/CASE-A/CASE-B/SOD-123/SOT-23/SOT-223 surface-mount components, according to one embodiment of the present invention.

DETAILED DESCRIPTION OF EMBODIMENTS

Figure 1A:
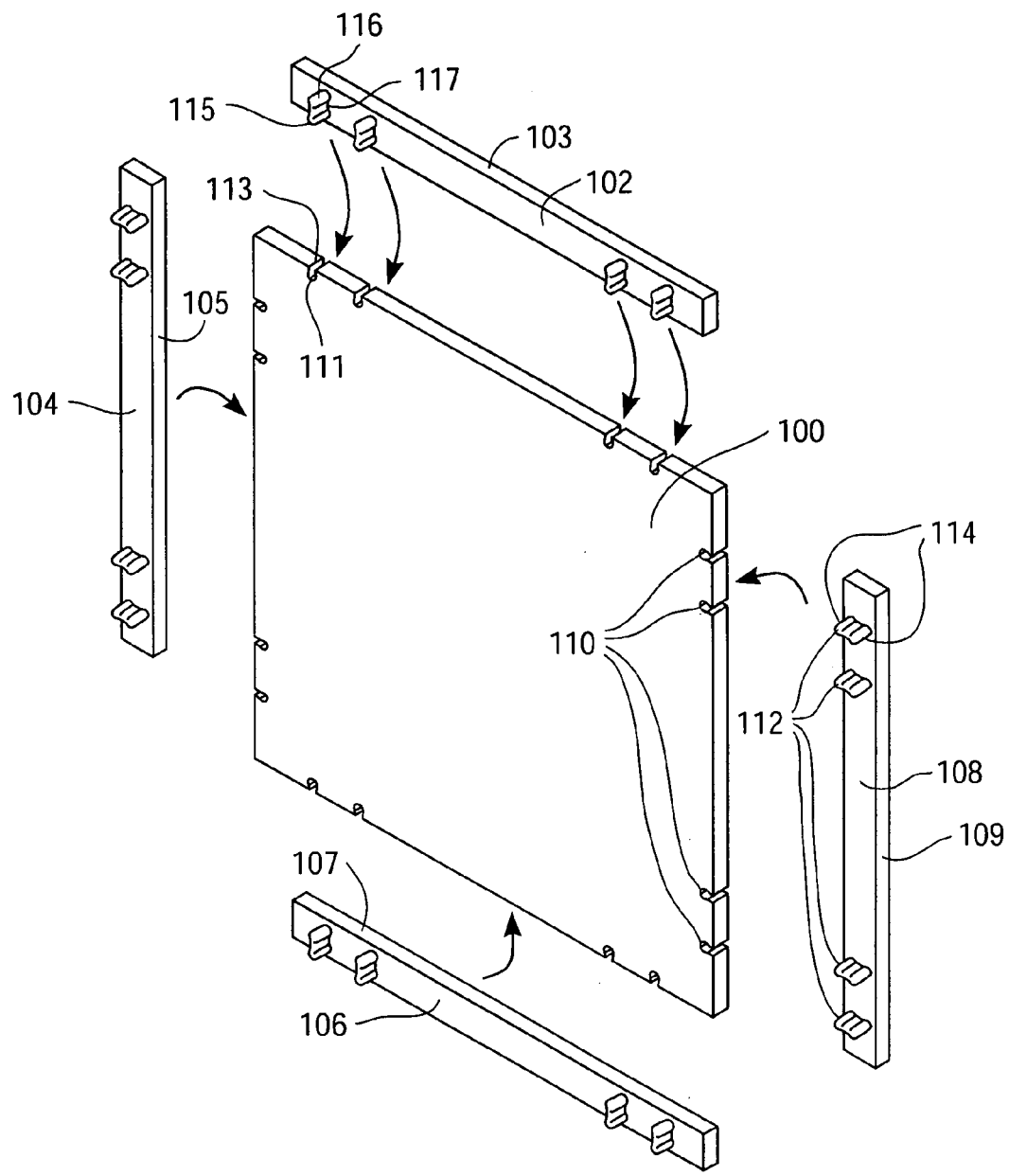
FIG. 1A is a perspective view of an Electronic Circuit Building Block and four mechanical bridge connectors before they are connected to the Electronic Circuit Building Block, according to one embodiment of the present invention.

The embodiments of the present invention will be described below with reference to the accompanying drawings. Like reference numerals are used for like elements in the accompanying drawings.

FIG. 1A is a perspective view of an electronic circuit board module ("Electronic Circuit Building Block") 100 and four mechanical bridge connectors 102, 104, 106, 108 before they are connected to the Electronic Circuit Building Block™ 100, according to one embodiment of the present invention. In one embodiment, the Electronic Circuit Building Block 100 preferably includes four female interlocking elements (slots) 110 on each edge, since having four female interlocking elements 110 on each edge provides strength for rigidly interlocking the mechanical bridge connectors 102, 104, 106, and 108 with the Electronic Circuit Building Block 100. However, one or more female interlocking elements 110 may be used on each edge of the Electronic Circuit Building Block 100. The female interlocking elements 110 have a shape of a half mushroom or a half dumbbell, including a substantially straight portion 113 open at the edge of the circuit board 100 and a substantially rounded portion 111 connected to the straight portion 113.

The Electronic Circuit Building Block 100 is also pre-configured to hold surface-mount components (not shown) and/or through-hole components (not shown) and also includes pre-routed traces (not shown) for interconnecting the surface-mount components and/or the through-hole components mounted thereon to one another. The pre-routed traces and pre-configuration for holding surface-mount components and/or through-hole components will be illustrated in more detail with reference to FIGS. 3–22. In one embodiment, the Electronic Circuit Building Block 100 has a size of 2 inches by 2 inches, although any size of Electronic Circuit Building Block 100 may be used.

The mechanical bridge connectors 102, 104, 106, 108 are designed to interlock with the Electronic Circuit Building Block 100 from one side of the Electronic Circuit Building Block 100, and also join other Electronic Circuit Building Blocks (not shown) with the Electronic Circuit Building Block 100 with a close fit. The mechanical bridge connectors 102, 104, 106, 108 have bodies 103, 105, 107, 109 with cross-sections that are rectangular with two parallel edges substantially longer than the other two parallel edges. In this manner, the mechanical bridge connectors 102, 104, 106, 108 do not interfere with any through-hole components (not shown) or surface-mount components (not shown) mounted on the Electronic Circuit Building Block 100.

The mechanical bridge connectors 102, 104, 106, 108 include male interlocking elements (protruding elements) 112 that are inserted into their corresponding female interlocking elements 110 of the Electronic Circuit Building Block 100. In one embodiment, the mechanical bridge connectors 102, 104, 106, 108 each include four male interlocking elements 112 (protruding elements), as the Electronic Circuit Building Block 100 has four corresponding female interlocking elements 110. However, there could be one or more male interlocking elements 112 on the mechanical bridge connectors 102, 104, 106, 108, and the number of male interlocking elements 112 may even be different from the number of female interlocking elements 110. In one embodiment, the mechanical bridge connectors 102, 104, 106, 108 have a length of 2 inches or slightly less than 2 inches, although any length for the mechanical bridge connector 112 may be used.

The male interlocking elements 112 have a mushroom shape or dumbbell shape including a first substantially rounded portion 115, a second substantially rounded portion 116, and a substantially straight portion 117 between the first and second substantially rounded portions 115, 116. The first substantially rounded portion 115 and a first half of the straight portion 117 connected to the first substantially rounded portion 115 are inserted into the female interlocking elements 110 of the Electronic Circuit Building Block 100 from the direction of one side (surface) of the Electronic Circuit Building Block 100. The second substantially rounded portion 116 and a second half of the straight portion 117 connected to the second substantially rounded portion 116 are inserted into the female interlocking elements (not shown) of another Electronic Circuit Building Block (not shown) to join the two Electronic Circuit Building Blocks, as will be illustrated in detail with reference to FIGS. 1C–1H. As a result, the mechanical bridge connectors 102, 104, 106, 108 lock into one side (surface) of the Electronic Circuit Building Block 100, providing backing support on one side of the Electronic Circuit Building Block 100 and one-sided out-of-plane mating with the Electronic Circuit Building Block 100.

The rounded edges 114, 115, 116 of the male interlocking elements 112 provide great fatigue resistance for multiple insertions into the female interlocking elements 110. The rounded edges 114, 115, 116 form a co-planarity with the Electronic Circuit Building Block 100 and its interference fit is intended to provide an in-plane locking with the Electronic Circuit Building Blocks 100. This locking feature stabilizes the in-plane movement of the mechanical bridge connectors 108.

In one embodiment, the mechanical bridge connectors 102, 104, 106, 108 are made of thermal plastic material and can withstand repeated out-of-plane assembly and disassembly with the Electronic Circuit Building Block 100. The mechanical bridge connectors 102, 104, 106, 108 can be either machined or injection molded. In one embodiment, the material forming the mechanical bridge connector is pliable and can withstand a wave solder thermal environment.

Figure 1B:
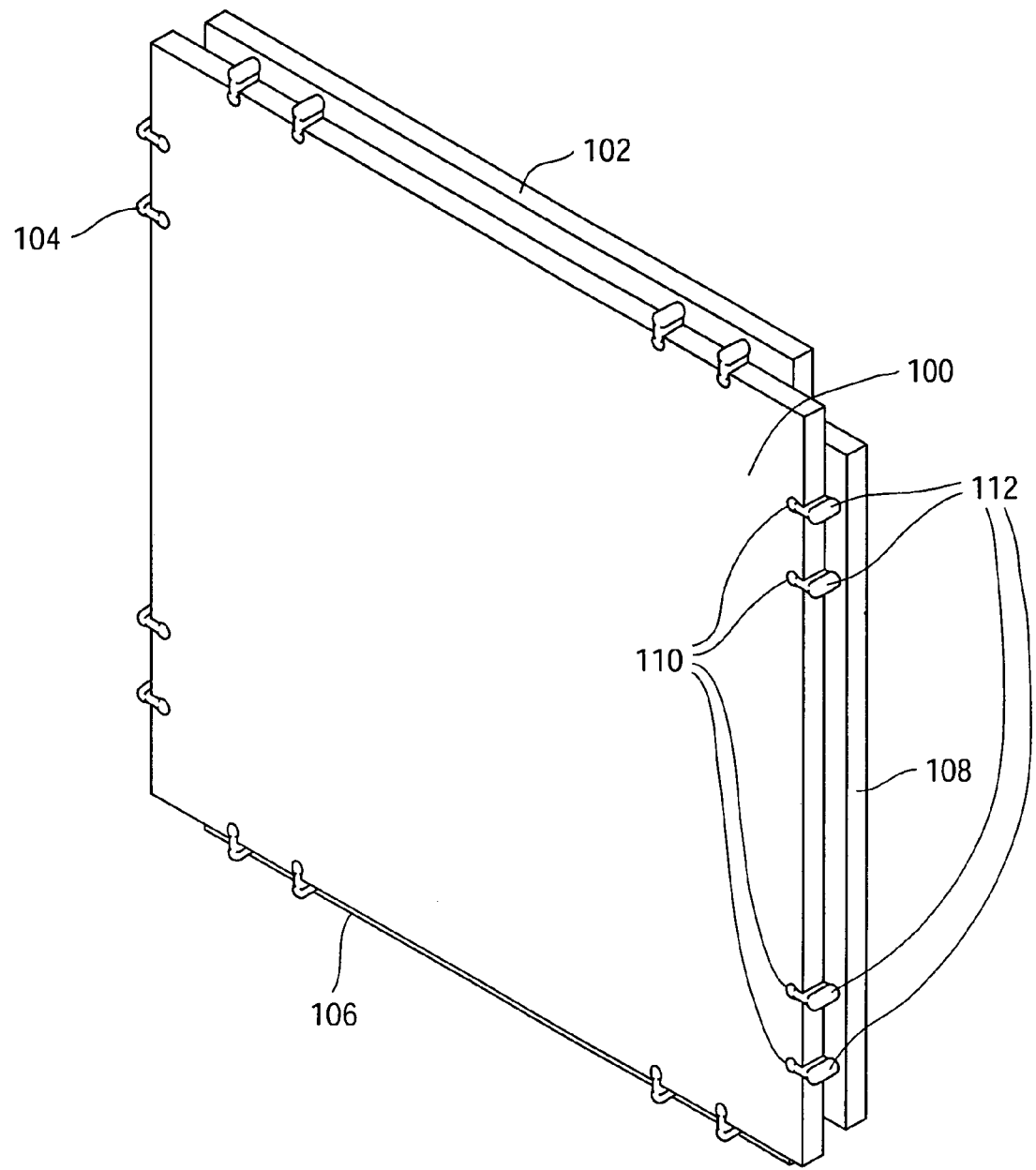
FIG. 1B is a perspective view of an Electronic Circuit Building Block and four mechanical bridge connectors after they are connected to the Electronic Circuit Building Block, according to one embodiment of the present invention.

FIG. 1B is a perspective view of the Electronic Circuit Building Block 100 and four mechanical bridge connectors 102, 104, 106, 108 of FIG. 1A after they are connected to the Electronic Circuit Building Block 100, according to one embodiment of the present invention. As shown in FIG. 1B, each of the male interlocking elements 112 is inserted into the corresponding female interlocking elements 110 of the Electronic Circuit Building Block 100, thus connecting the Electronic Circuit Building Blocks 100 with the mechanical bridge connectors 102, 104, 106, 108. The male interlocking elements 112 of the mechanical bridge connectors 102, 104, 106, 108 are inserted into the female interlocking elements (slots) 110 on one side (here, the back side) of the Electronic Circuit Building Block 100, providing backing support on one side. This feature provides the bridge connectors 102, 104, 106, 108 a one-sided out-of-plane mating with the Electronic Circuit Building Block 100.

Figure 1C:
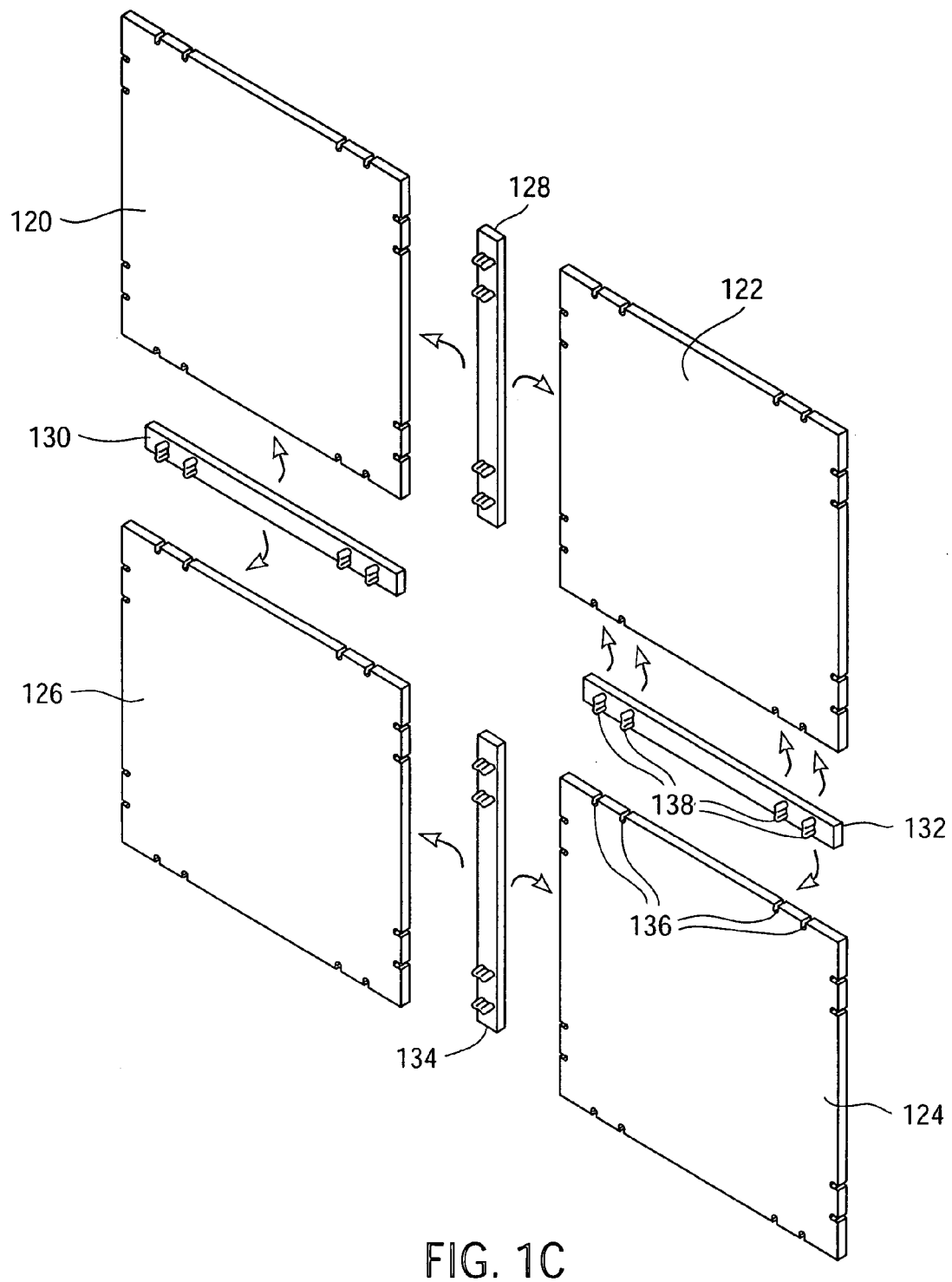
FIG. 1C is a perspective view of four Electronic Circuit Building Blocks and four mechanical bridge connectors before they are connected to one another, according to one embodiment of the present invention.

FIG. 1C is a perspective view of four Electronic Circuit Building Blocks 120, 122, 124, 126 and four mechanical bridge connectors 128, 130, 132, 134 before they are connected to the Electronic Circuit Building Blocks 120, 122, 124, 126, according to one embodiment of the present invention. As shown in FIG. 1C, the Electronic Circuit Building Blocks 120, 122, 124, 126 have female interlocking elements 136 identical to the female interlocking elements 110 described in FIG. 1A. In one embodiment, the Electronic Circuit Building Blocks 120, 122, 124, 126 have a size of 2 inches by 2 inches. The Electronic Circuit Building Blocks 120, 122, 124, 126 are also pre-configured to hold surface-mount components (not shown) and/or through-hole components (not shown) and also includes pre-routed traces (not shown) for interconnecting the surface-mount components and/or the through-hole components mounted thereon to one another. Each of the Electronic Circuit Building Blocks 120, 122, 124, 126 may have pre-configurations for holding surface-mount components or through-hole components and pre-routed traces that are same as or different from those on other Electronic Circuit Building Blocks 120, 122, 124, 126. The mechanical bridge connectors 128, 130, 132, 134 also have male interlocking elements 138 that are identical to the male interlocking elements 112 of FIG. 1A.

In use, the mechanical bridge connector 128 connects the Electronic Circuit Building Blocks 120, 122. The mechanical bridge connector 130 connects the Electronic Circuit Building Blocks 120, 126. The mechanical bridge connector 132 connects the Electronic Circuit Building Blocks 122, 124. The mechanical bridge connector 134 connects the Electronic Circuit Building Blocks 124, 126.

Figure 1D:
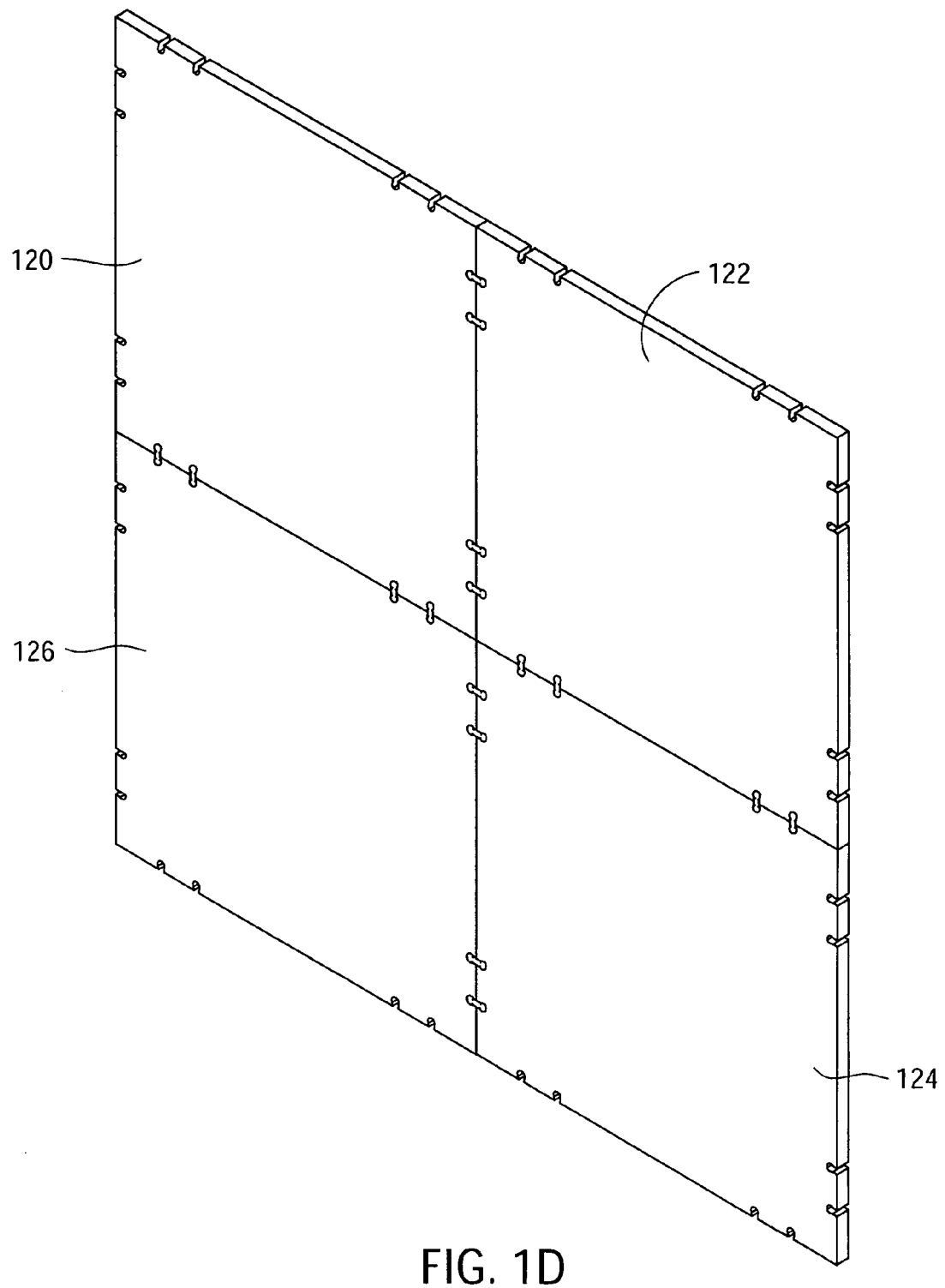
FIG. 1D is a perspective view of four Electronic Circuit Building Blocks and four mechanical bridge connectors after they are connected to one another, according to one embodiment of the present invention.

FIG. 1D is a perspective view of the four Electronic Circuit Building Blocks 120, 122, 124, 126 and four mechanical bridge connectors 128, 130, 132, 134 after they are connected to one another, according to one embodiment of the present invention. As shown in FIG. 1D and referring to FIG. 1C, each of the male interlocking elements 138 of the mechanical bridge connectors 128, 130, 132, 134 is inserted into the corresponding female interlocking elements 136 of two adjacent Electronic Circuit Building Blocks (e.g., Electronic Circuit Building Blocks 120 and 122, 122 and 124, 124 and 126, 126 and 120), thus mechanically connecting the two adjacent Electronic Circuit Building Blocks and forming a larger electronic circuit board (4 inches by 4 inches). In one embodiment, the male interlocking elements 138 of the mechanical bridge connectors 128, 130, 132, 134 are inserted into the female interlocking elements (slots) 136 of two adjacent Electronic Circuit Building Blocks 120, 122, 124, 126 on one side of the Electronic Circuit Building Blocks 120, 122, 124, 126, providing backing support on that one side and a one-sided out-of-plane mating with the electronic circuit boards 120, 122, 124, 126.

Each of the Electronic Circuit Building Blocks 120, 122, 124, 126 can be used to hold electronic circuitry comprised of various surface-mount components (e.g., integrated circuit chips) and various through-hole components (e.g., passive components such as resistors and capacitors). For example, each Electronic Circuit Building Block 120, 122, 124, 126 may be devoted to different functional parts of the electronic circuitry. The components mounted on the same Electronic Circuit Building Blocks 120, 122, 124, 126 are interconnected to each other via the pre-routed traces printed on the Electronic Circuit Building Blocks 120, 122, 124, 126 and/or via jumper wires wrapped around or soldered to the components. The components mounted on different Electronic Circuit Building Blocks 120, 122, 124, 126 may be interconnected to each other via jumper wires wrapped around or soldered to the components and/or via programmable transceiver components for wireless transmission and reception of signals between the various components on the separate Electronic Circuit Building Blocks 120, 122, 124, 126.

Figure 1E:
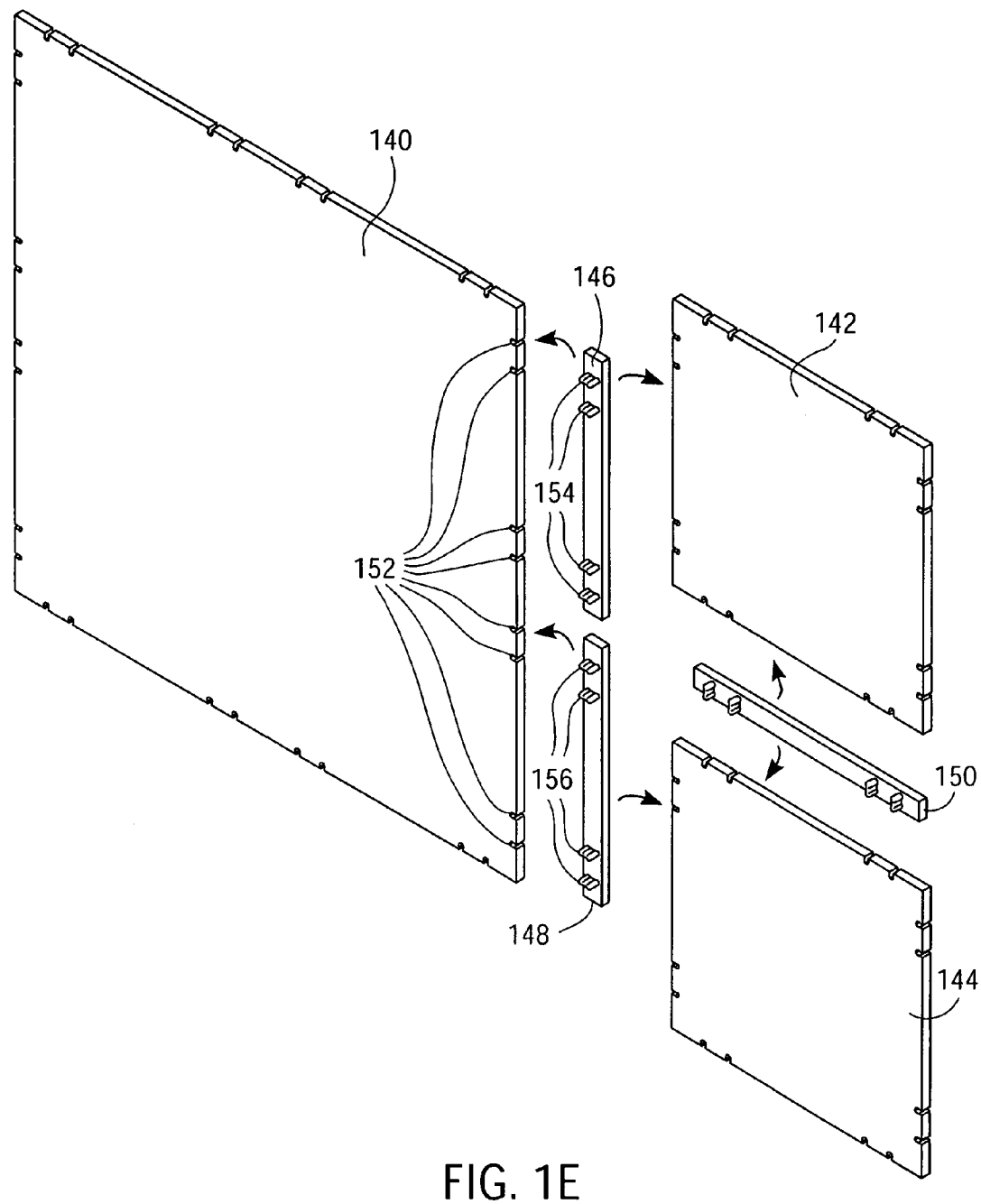
FIG. 1E is a perspective view of three Electronic Circuit Building Blocks and three mechanical bridge connectors before they are connected to one another, according to one embodiment of the present invention.

FIG. 1E is a perspective view of three Electronic Circuit Building Blocks 140, 142, 144 and three mechanical bridge connectors 146, 148, 150 before they are connected to one another, according to one embodiment of the present invention. As shown in FIG. 1E, the Electronic Circuit Building Blocks 140, 142, 144 have female interlocking elements 152 identical to the female interlocking elements 110 described in FIG. 1A. In one embodiment, the Electronic Circuit Building Block 140 has a size of 4 inches by 4 inches and the Electronic Circuit Building Blocks 142, 144 have a size of 2 inches by 2 inches. The Electronic Circuit Building Blocks 140, 142, 144 are also pre-configured to hold surface-mount components (not shown) and/or through-hole components (not shown) and also includes pre-routed traces (not shown) for interconnecting the surface-mount components and/or the through-hole components mounted thereon to one another. The mechanical bridge connectors 146, 148, 150 also have male interlocking elements 154, 156 that are identical to the male interlocking elements 112 of FIG. 1A.

In use, the mechanical bridge connector 146 connects the Electronic Circuit Building Blocks 140, 142 together. The mechanical bridge connector 148 connects the Electronic Circuit Building Blocks 140, 144 together. The mechanical bridge connector 150 connects the Electronic Circuit Building Blocks 142, 144 together.

Figure 1F:
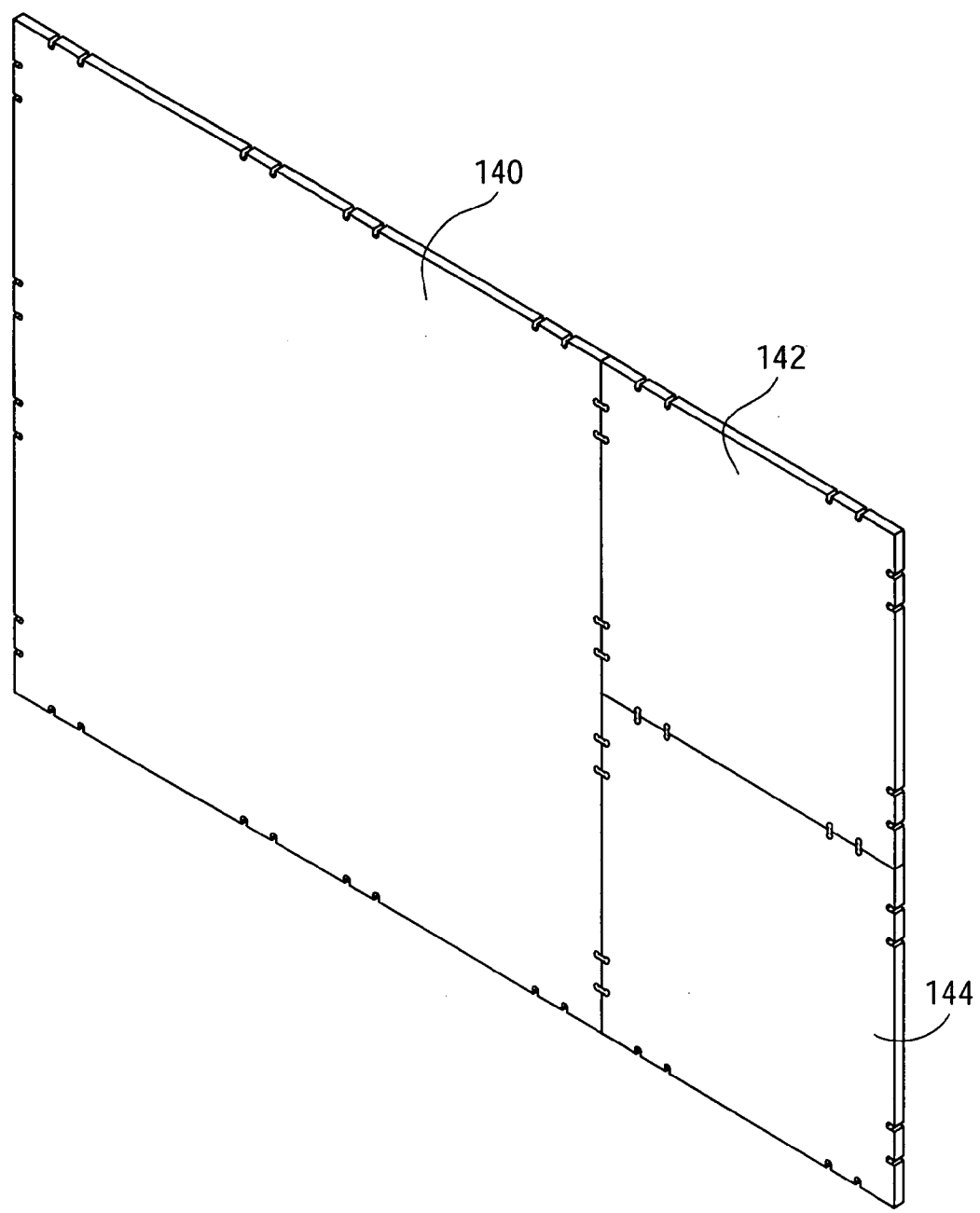
FIG. 1F is a perspective view of three Electronic Circuit Building Blocks and three mechanical bridge connectors after they are connected to one another, according to one embodiment of the present invention.

FIG. 1F is a perspective view of three Electronic Circuit Building Blocks 140, 142, 144 and three mechanical bridge connectors 146, 148, 150 after they are connected to one another, according to one embodiment of the present invention. As shown in FIG. 1F and referring to FIG. 1E, each of the male interlocking elements 154, 156 of the mechanical bridge connectors 146, 148, 150 is inserted into the corresponding female interlocking elements 152 of two adjacent Electronic Circuit Building Blocks (e.g., Electronic Circuit Building Blocks 140 and 142, 140 and 144, 142 and 144) on one side, thus mechanically connecting the two adjacent Electronic Circuit Building Blocks, forming a larger electronic circuit board (6 inches by 4 inches) with backing support on that one side, and providing a one-sided out-of-plane mating with the electronic circuit boards 140, 142, 144.

Figure 1G:
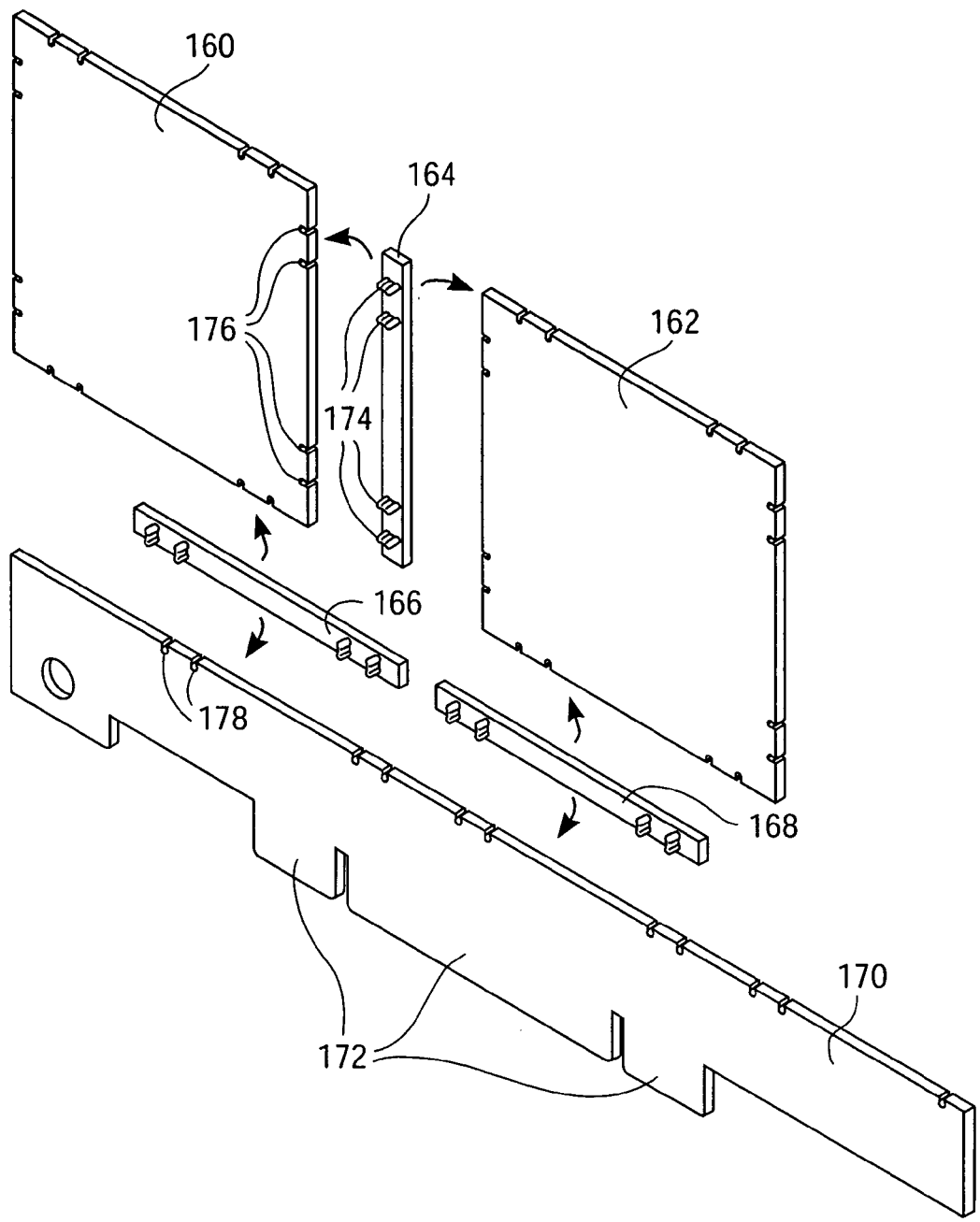
FIG. 1G is a perspective view of two Electronic Circuit Building Blocks, three mechanical bridge connectors, and a PCI interface module before they are connected to one another, according to one embodiment of the present invention.

FIG. 1G is a perspective view of two Electronic Circuit Building Blocks 160, 162, three mechanical bridge connectors 164, 166, 168, and a PCI (Peripheral Component Interconnect) interface module 170, before they are connected to one another, according to one embodiment of the present invention. As shown in FIG. 1G, the Electronic Circuit Building Blocks 160, 162 have female interlocking elements 176 identical to the female interlocking elements 110 described in FIG. 1A. In one embodiment, the Electronic Circuit Building Blocks 160, 162 have a size of 2 inches by 2 inches. The Electronic Circuit Building Blocks 160, 162 are also pre-configured to hold surface-mount components (not shown) and/or through-hole components (not shown) and also include pre-routed traces (not shown) for interconnecting the surface-mount components and/or the through-hole components mounted thereon to one another.

The mechanical bridge connectors 164, 166, 168 also have male interlocking elements 174 that are identical to the male interlocking elements 112 of FIG. 1A. The PCI interface module 170 has standard PCI connection interfaces 172 for connection to a standard PCI slot in a computer and also female interlocking elements 178 identical to the female interlocking elements 110 described in FIG. 1A, so that the PCI interface module 170 can be connected to the Electronic Circuit Building Blocks 160, 162.

In use, the mechanical bridge connector 164 connects the Electronic Circuit Building Blocks 160, 162 together. The mechanical bridge connector 166 connects the Electronic Circuit Building Block 160 with the PCI interface module 170. The mechanical bridge connector 168 connects the Electronic Circuit Building Blocks 162 with the PCT interface module 170.

Figure 1H:
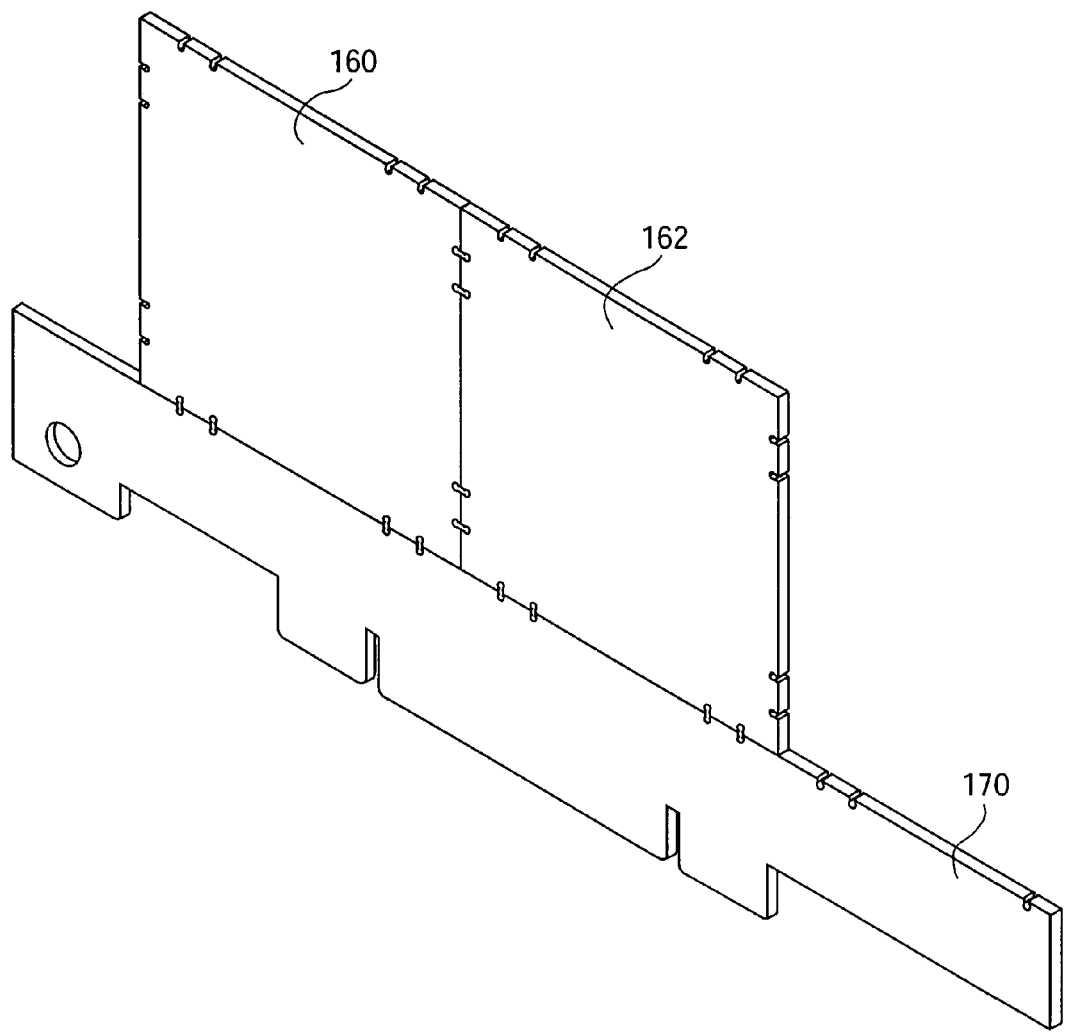
FIG. 1H is a perspective view of two Electronic Circuit Building Blocks, three mechanical bridge connectors, and a PCI interface module after they are connected to one another, according to one embodiment of the present invention.

FIG. 1H is a perspective view of two Electronic Circuit Building Blocks 160, 162, three mechanical bridge connectors 164, 166, 168, and a PCI interface module 170 after they are connected to one another, according to one embodiment of the present invention. As shown in FIG. 1H and referring to FIG. 1G, each of the male interlocking elements 174 of the mechanical bridge connectors 164, 166, 168 is inserted into the corresponding female interlocking elements 176 of the adjacent Electronic Circuit Building Blocks 160, 162 and the PCI interface module 170 on one side, thus mechanically connecting the two adjacent Electronic Circuit Building Blocks 160, 162 and the PCI interface module 170 together. As a result, a larger electronic circuit board (4 inches by 2 inches) with backing support on that one side and a PCI interface 170 is achieved.

FIG. 2 is a diagram illustrating a female interlocking element (slot) 200 on the edges of an Electronic Circuit Building Block in detail, according to one embodiment of the present invention. As explained previously, the female interlocking elements 200 are used for the physical interconnection between Electronic Circuit Building Blocks 202 and the mechanical bridge connectors (not shown).

As explained previously, the female interlocking elements 200 have a shape of a half mushroom or a half dumbbell, including a substantially straight portion 205 open at the edge of the circuit board 202 and a substantially rounded portion 206 connected to the straight portion 205. Half parts of each of the male interlocking elements (not shown) of the mechanical bridge connectors (not shown) are inserted into the female interlocking elements 200 of a first Electronic Circuit Building Block and the remaining half parts of each of the male interlocking elements of the mechanical bridge connector (not shown) are inserted into the female interlocking elements of a second Electronic Circuit Building Block (not shown) to connect the first and second Electronic Circuit Building Blocks together. Therefore, a half part of each of the male interlocking elements has a shape that substantially conforms to the shape of a female interlocking element 200.

In one embodiment, there are four female interlocking elements (slots) 200 on each edge of the 2 inches by 2 inches Electronic Circuit Building Block 202. In one embodiment, the female interlocking elements 200 are arranged on the edges of the Electronic Circuit Building Block 200 such that they are separated from each other by either 0.2 inches or 1.1 inches and from the corner of the Electronic Circuit Building Block 202 by 0.247 inches. In one embodiment, each female interlocking element 200 has an opening 204 that is 0.030 inches wide, the distance from the edge of the opening 204 to the center of the rounded portion 206 is 0.027 inches, and the rounded portion 206 has a curvature radius of 0.020 inches, as shown in FIG. 2.

FIG. 3 is a diagram illustrating an Electronic Circuit Building Block 300 with pre-routed traces and pre-configured to hold through-hole components, according to one embodiment of the present invention. The space between each through-hole component lead 302 is 0.1 inch. The through-hole components (e.g., resistors, capacitors) are placed into through-hole components leads 302 and may be soldered to the through-hole components leads 302. As shown on the top-side of the Electronic Circuit Building Block 300 in FIG. 3, the through-holes are interconnected to one another via pre-routed trances 304 made of conductive material and disposed on the Electronic Circuit Building Block 300 according to a predetermined pattern. The pattern of pre-routed traces 304 may be modified for a suitable purpose. In one embodiment, the pre-routed traces 304 interconnect the through-holes to the outer edges of the board, so that the through-hole components may be connected to other components on different Electronic Circuit Building Blocks 300 joined together with short jumper wires or wrapping wires and the like. The through-hole components may also be interconnected to each other by other means, e.g., soldering of jumper wires or wire-wrapping.

The through-hole pattern arrangement has a 0.05 inch offset spacing, i.e., the through-holes in each adjacent row of through-holes are offset by 0.05 inches. The Electronic Circuit Building Block 300 has a size of 2 inches by 2 inches. There are four female interlocking elements (slots) 306 on each edge of the Electronic Circuit Building Block 300 to support the scalable feature illustrated in FIGS. 1A–1H. The total number of through-holes for this specific 2"×2" Electronic Circuit Building Block 300 is 668, although any number of through-holes may be used. 70 holes are in 0.05 inch size (diameter), 580 holes are in 0.038 inch size (diameter), 18 holes are in 0.030 inch size (diameter), in order to accommodate different sizes of through-hole components. The pre-routed traces 304 have different trace-widths, i.e., 0.020 inch and 0.030 inch trace-widths, to handle electronic signal connections and ground connections. 12 ground holes (GND) are connected to a copper plane (not shown) on the bottom side of the board. The Electronic Circuit Building Block 300 accommodates the mounting of through-hole components such as a capacitor, a resistor, diode, inductor, crystal, header, jumper, fuse, transistor, voltage regulator, DIP (Dual In-Line Package) IC with 70 pins or sockets, DIP switches, relay, RJ11 connector, RJ45 connector, etc. The same design concept can be extended to obtain Electronic Circuit Building Blocks of any size, e.g., larger than 2 inches by 2 inches, for example, 4 inches by 4 inches, 6 inches by 6 inches, etc. Also, the space between each through-hole component lead 302 may be modified to 2 mm with 1 mm offset spacing.

FIG. 4 is a diagram illustrating an Electronic Circuit Building Block 400 with pre-routed traces and pre-configured to hold 0603/0805/1206/CASE-A/CASE-B/SOD-123/SOT-23/SOT-223 surface-mount components and through-hole components, according to one embodiment of the present invention. In this embodiment, the Electronic Circuit Building Block 400 has a size of 2 inches by 2 inches and accommodates the mounting of up to a maximum of 55 pieces of 0603 packages, maximum 35 pieces of 0805 packages, 4 pieces of SOD-123 packages, 1 piece of SOT-223 package, 6 pieces of SOT-23 package, 10 pieces of CASE-B packages and some through-hole passive components.

The Electronic Circuit Building Block 400 includes four female interlocking elements (slots) 406 on each edge of the board to support the scalable feature described in FIGS. 1A–1H. The Electronic Circuit Building Block 400 also includes through-hole leads 404 with 0.1 inch lead spacing to hold through-hole components. The through-hole leads 404 are arranged with 0.05 inch offset spacing, i.e., the through-holes in each adjacent row of through-holes are offset by 0.05 inches. The pre-routed traces 402 interconnect the surface-mount components and the through-holes to the outer edges of the board. There are 426 through-holes 404 in 0.038 inch size (diameter). The pre-routed traces 402 have 0.020 inch and 0.030 inch trace-widths to handle electronic signal connections and ground connections. There are 12 ground holes (GND) connected to a copper plane (not shown) on the bottom side. The same concept can be extended to obtain any board sizes, e.g., 4 inches by 4 inches, 6 inches by 6 inches, etc.

Figure 5:
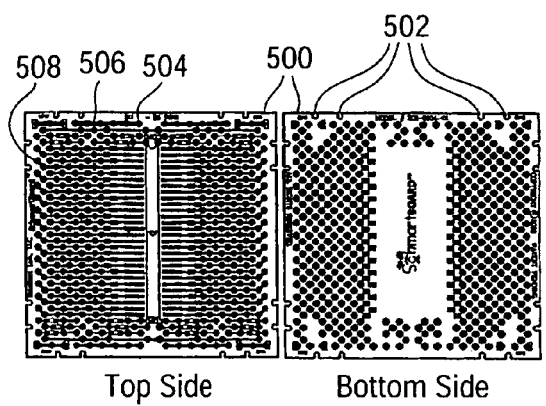
FIG. 5 is a diagram illustrating an Electronic Circuit Building Block with pre-routed traces and pre-configured to hold SO IC packages from 4 pins to 56 pins with 0.050 inch pitch, 20 pieces of 0603 package and multiple through-hole components, according to one embodiment of the present invention.

FIG. 5 is a diagram illustrating an Electronic Circuit Building Block 500 with pre-routed traces and pre-configured to hold a SO IC package from 4 pins to 56 pins with 0.050" pitch, 20 pieces of 0603 package and multiple through-hole components, according to one embodiment of the present invention. The Electronic Circuit Building Block 500 includes four female interlocking elements (slots) 502 on each edge of the board to support the scalable feature described in FIGS. 1A–1H. The Electronic Circuit Building Block 500 also includes through-holes 504 that are spaced apart by 0.1 inches to hold through-hole components. The through-hole leads 504 are arranged with 0.05 inch offset spacing, i.e., the through-holes in each adjacent row of through-holes are offset by 0.05 inches. The pre-routed traces 506 interconnect the surface-mount components and the through-holes to the outer edges of the board 500.

The Electronic Circuit Building Block 500 includes 490 through-holes 506 in 0.038 inch size (diameter). The pre-routed traces 506 have widths of 0.010 inch, 0.020 inch and 0.030 to handle electronic signal connections and ground connections. There are 12 ground holes (GND) connected to a copper plane (not shown) on the bottom side. The end 508 of the pre-routed traces 506 are tilted by a 45 degree angle to allow for 0.1" dual row headers, and the inner contact points of the through-holes 504 have surface-mount pads (not shown) that can be used for mounting discrete components such as 0805's capacitors, resistors, inductors, etc. as well as general connecting wires. The bottom side of the Electronic Circuit Building Block 500 includes pre-designed surface-mount pads (not shown) connected to the ground plane (not shown) that can be used for mounting additional discrete 0805's components. The center-to-center spacing between the through-holes 504 is 0.1 inch. The same concept can be extended to obtain any board sizes, e.g., 4 inches by 4 inches, 6 inches by 6 inches, etc.

Figure 6:
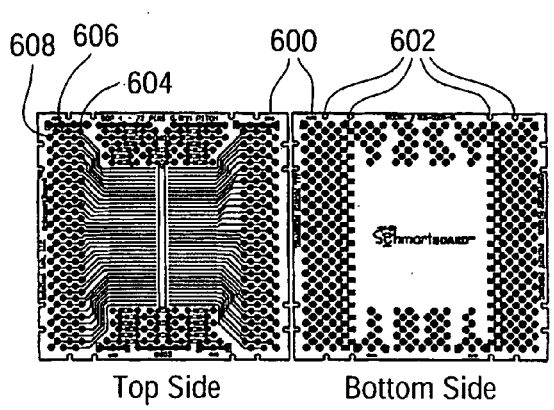
FIG. 6 is a diagram illustrating an Electronic Circuit Building Block with pre-routed traces and pre-configured to hold SO, SOP, QSOP, SSOP, TSSOP, PSSOP package ICs from 4 pins to 72 pins with 0.8 mm pitch, 30 pieces of 0603 discrete surface-mount packages and some through-hole components, according to one embodiment of the present invention.

FIG. 6 is a diagram illustrating an Electronic Circuit Building Block 600 with pre-routed traces and pre-configured to hold a SO, SOP, QSOP, SSOP, TSSOP, or PSSOP package ICs from 4 pins to 72 pins with 0.8 mm pitch, 30 pieces of 0603 discrete surface-mount packages and some through-hole components, according to one embodiment of the present invention. There are four female interlocking elements (slots) 602 on each edge of the board 600 to support the scalable feature described in FIGS. 1A–1H. The board 600 includes through-holes 604 with 0.1 inch lead spacing to hold through-hole components. The through-hole leads 604 are arranged with 0.05 inch offset spacing, i.e., the through-holes 604 in each adjacent row of through-holes 604 are offset by 0.05 inches.

The pre-routed traces 606 interconnect the surface-mount components and the through-holes to the outer edges of the board 600. The traces 606 have widths of 0.010 inch or 0.030 inch to handle electronic signal connections and ground connections. There are 14 ground holes (GND) connected to a copper plane (not shown) on the bottom side. The end-points 608 of the traces 606 are tilted with a 45 degree angle to allow for 0.1" dual row headers and the inner contact points of the through holes 604 have surface-mount pads (not shown) that can be used for mounting discrete components such as 0805's capacitors, resistors, inductors, etc. as well as general connecting wires. The bottom side of the board 600 includes pre-designed surface-mount pads (not shown) connected to the ground plane (not shown) that can be used for mounting additional discrete 0805's components. The center-to-center spacing between the through-holes 604 is 0.1 inch. The same design concept can be extended to obtain any board sizes, e.g., 4 inches by 4 inches, 6 inches by 6 inches, etc.

Figure 7:
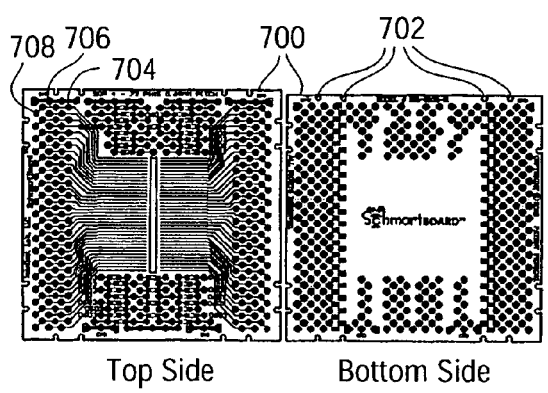
FIG. 7 is a diagram illustrating an Electronic Circuit Building Block with pre-routed traces and pre-configured to hold SO, SOP, QSOP, SSOP, TSSOP, PSSOP package ICs from 4 pins to 72 pins with 0.65 mm pitch and 37 pieces of 0603 package and some through-hole components, according to one embodiment of the present invention.

FIG. 7 is a diagram illustrating an Electronic Circuit Building Block 700 with pre-routed traces and pre-configured to hold a SO, SOP, QSOP, SSOP, TSSOP, or PSSOP package IC from 4 pins to 72 pins with 0.65 mm pitch and 37 pieces of 0603 package and some through-hole components, according to one embodiment of the present invention. The board 700 includes four slots 702 on each edge to support the scalable feature described in FIGS. 1A–1H. The board 700 also includes through-holes 704 that are spaced apart by 0.1 inch lead spacing to hold through-hole components. The through-hole leads 704 are arranged with 0.05 inch offset spacing, i.e., the through-holes 704 in each adjacent row of through-holes 704 are offset by 0.05 inches.

The pre-routed traces 706 interconnect the surface-mount components and the through-holes to the outer edges of the board 700. The board 700 includes 351 through-holes in 0.038 inch size (diameter). The traces 706 have widths of 0.008 inches or 0.030 inches to handle electronic signal connections and ground connections. There are 14 ground holes (GND) connected to a copper plane (not shown) on the bottom side of the board 700. The end-points 708 of the routes 706 are tilted with a 45 degree angle to allow for 0.1" dual row headers and the inner contact points of the through-holes 704 have surface-mount pads (not shown) that can be used for mounting discrete components such as 0805's capacitors, resistors, inductors, etc. as well as general connecting wires. The bottom side of the board 700 includes pre-designed surface-mount pads (not shown) connected to the ground plane (not shown) that can be used for mounting additional discrete 0805's components. The center-to-center spacing between the through-holes 704 is 0.1 inch. The same design concept can be extended to obtain any board sizes, e.g., 4 inches by 4 inches, 6 inches by 6 inches, etc.

Figure 8:
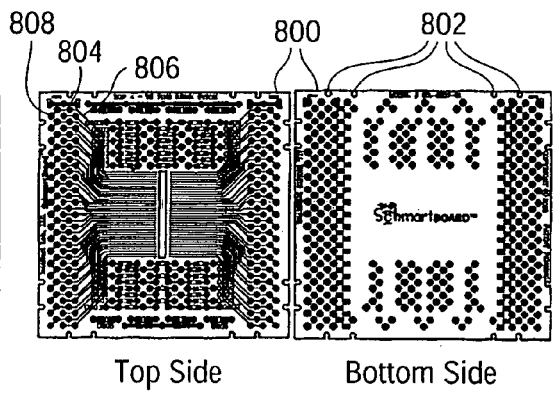
FIG. 8 is a diagram illustrating an Electronic Circuit Building Block with pre-routed traces and pre-configured to hold SO, SOP, QSOP, SSOP, TSSOP, PSSOP package IC from 4 pins to 72 pins with 0.5 mm pitch surface-mount components, 43 pieces of 0603 packages, 8 pieces of 0805 packages and some through-hole components, according to one embodiment of the present invention.

FIG. 8 is a diagram illustrating an Electronic Circuit Building Block 800 with pre-routed traces and pre-configured to hold a SO, SOP, QSOP, SSOP, TSSOP, or PSSOP package IC from 4 pins to 72 pins with 0.5 mm pitch surface-mount components, 43 pieces of 0603 packages, 8 pieces of 0805 packages and some through-hole components, according to one embodiment of the present invention. The board 800 includes four slots 802 on each edge of the board 800 to support the scalable feature described in FIGS. 1A–1H. The board also includes through-holes 804 with 0.1 inch lead spacing to hold through-hole components. The through-hole leads 804 are arranged with 0.05 inch offset spacing, i.e., the through-holes 804 in each adjacent row of through-holes 804 are offset by 0.05 inches.

The pre-routed traces 806 interconnect the surface-mount components and the through-holes to the outer edges of the board 800. The board 800 includes 312 holes in 0.038 inch size (diameter). The traces 806 have widths of 0.008 inch, 0.010 inch, 0.020 inch, or 0.030 inch to handle electronic signal connections and ground connections. There are 14 ground holes (GND) connected to a copper plane (not shown) on the bottom side. The end-points 808 of the routes 806 are tilted with a 45 degree angle to allow for 0.1 dual row headers and the inner contact points of the through holes 804 have surface-mount pads that can be used for mounting discrete components such as 0805's capacitors, resistors, inductors, etc. as well as general connecting wires. The bottom side of the board 800 has pre-designed surface-mount pads (not shown) connected to the ground plane (not shown) that can be used for mounting additional discrete 0805's components. The center-to-center spacing between the through-holes 804 is 0.1 inch. The same design concept can be extended to obtain any board sizes, e.g., 4 inches by 4 inches, 6 inches by 6 inches, etc.

Figure 9:
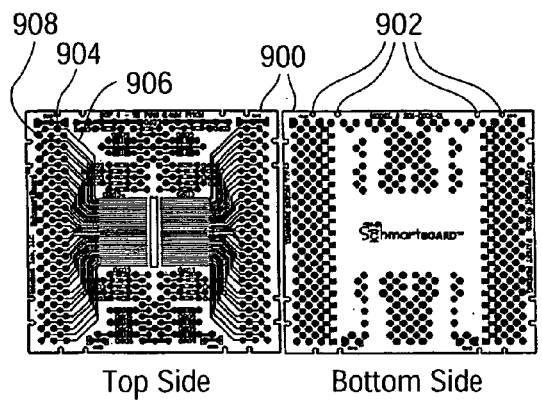
FIG. 9 is a diagram illustrating an Electronic Circuit Building Block with pre-routed traces and pre-configured to hold SO, SOP, QSOP, SSOP, TSSOP, PSSOP package IC from 4 pins to 72 pins with 0.4 mm pitch surface-mount components, 23 pieces of 0603 package, 10 pieces of 0805 package and some through-hole components, according to one embodiment of the present invention.

FIG. 9 is a diagram illustrating an Electronic Circuit Building Block 900 with pre-routed traces and pre-configured to hold a SO, SOP, QSOP, SSOP, TSSOP, or PSSOP package IC from 4 pins to 72 pins with 0.4 mm pitch surface-mount components, 23 pieces of 0603 package, 10 pieces of 0805 package and some through-hole components, according to one embodiment of the present invention. There are 4 slots on each edge of the board 900 to support the scalable feature described in FIGS. 1A–1H. The board 900 also includes through-holes 904 with 0.1 inch lead spacing to hold through-hole components. The through-hole leads 904 are arranged with 0.05 inch offset spacing, i.e., the through-holes 904 in each adjacent row of through-holes 904 are offset by 0.05 inches.

The pre-routed traces 906 interconnect the surface-mount components and the through-holes to the outer edges of the board 900. The board 900 includes 324 through-holes in 0.038 inch size (diameter). The traces 906 have widths of 0.008 inch, 0.010 inch, 0.020 inch or 0.030 inch to handle electronic signal connections and ground connections. The board 900 also includes 10 ground through-holes connected to a copper plane (not shown) on the bottom side. The end-points 908 of the traces 906 are tilted with a 45 degree angle to allow for 0.1" dual row headers and the inner contact points of the through-holes 904 have surface-mount pads (not shown) that can be used for mounting discrete components such as 0805's capacitors, resistors, inductors, etc. as well as general connecting wires. The bottom side of the board 900 includes pre-designed surface-mount pads (not shown) connected to the ground plane (not shown) that can be used for mounting additional discrete 0805's components. The center-to-center spacing between the through-holes 904 and surface-mount pad is 0.1 inch. The same concept can extend to a larger board size, e.g., 4 inches by 4 inches, 6 inches by 6 inches, etc.

Figure 10:
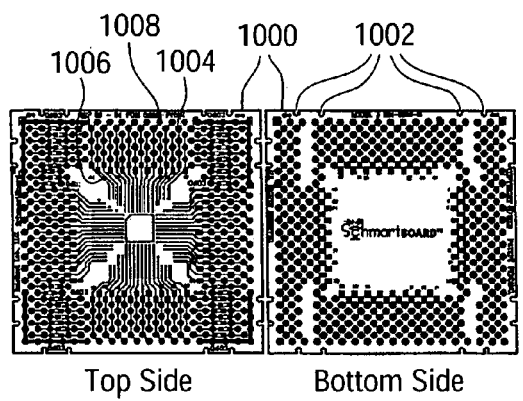
FIG. 10 is a diagram illustrating an Electronic Circuit Building Block with pre-routed traces and pre-configured to hold QFP, TQFP, PQFP package ICs from 32 pins to 64 pins with 0.8 mm pitch surface-mount components, 38 pieces of 0603 package, and some through-hole components, according to one embodiment of the present invention.

FIG. 10 is a diagram illustrating an Electronic Circuit Building Block 1000 with pre-routed traces and pre-configured to hold a QFP, TQFP, PQFP package IC from 32 pins to 64 pins with 0.8 mm pitch surface-mount components, 38 pieces of 0603 package, and some through-hole components, according to one embodiment of the present invention. There are 4 slots on each edge of the board 1000 to support the scalable feature described in FIGS. 1A–1H. The board 1000 includes through-holes 1004 with 0.1 inch lead spacing to hold through-hole components. The through-hole leads 1004 are arranged with 0.05 inch offset spacing, i.e., the through-holes 1004 in each adjacent row of through-holes 1004 are offset by 0.05 inches.

The pre-routed traces 1006 interconnect the surface-mount components and the through-holes to the outer edges of the board 100. The board 1000 includes 426 through-holes in 0.038 inch size (diameter). The traces 1006 have widths of 0.008 inch, 0.010 inch, or 0.030 inch trace widths to handle electronic signal connections and ground connections. The board 1000 also includes 22 ground holes (GND) connected to a copper plane (not shown) on the bottom side. The end-points 1008 of the routes 1006 are tilted with a 45 degree angle to allow for 0.1" dual row headers, and the inner contact points of the through-holes 1004 include surface-mount pads (not shown) that can be used for mounting discrete components such as 0805's capacitors, resistors, inductors, etc. as well as general connecting wires. The bottom side of the board 1000 has pre-designed surface-mount pads (not shown) connected to the ground plane that can be used for mounting additional discrete 0805's components. The center-to-center spacing between the through-holes 1004 is 0.1 inch. The same concept can extend to any board size, e.g., 4 inches by 4 inches, 6 inches by 6 inches, etc.

Figure 11:
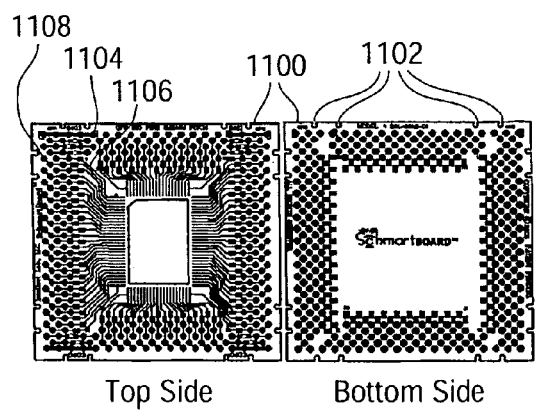
FIG. 11 is a diagram illustrating an Electronic Circuit Building Block with pre-routed traces and pre-configured to support 100 pins QFP, TQFP, PQFP package IC with 0.65 mm pitch surface-mount components, 10 pieces of 0603 package, and some through-hole components, according to one embodiment of the present invention.

FIG. 11 is a diagram illustrating an Electronic Circuit Building Block 1100 with pre-routed traces and pre-configured to support a 100 pin QFP, TQFP, PQFP package IC with 0.65 mm pitch surface-mount components, 10 pieces of 0603 package, and some through-hole components, according to one embodiment of the present invention. The board 1100 includes 4 slots 1102 on each edge of the board 1100 to support the scalable feature described in FIGS. 1A–1H. The board 1100 also includes through-holes 1104 with 0.1 inch lead spacing to hold through-hole components. The through-hole leads 1104 are arranged with 0.05 inch offset spacing, i.e., the through-holes 1104 in each adjacent row of through-holes 1104 are offset by 0.05 inches.

The pre-routed traces 1106 interconnect the surface-mount components and the through-holes to the outer edges of the board 1100. The board 1100 includes 330 through-holes in 0.038 inch size (diameter). The traces 1106 have widths of 0.008 inch, 0.010 inch, or 0.030 inch. There are 9 ground through-holes (GND) connected to a copper plane (not shown) on the bottom side. The end-points 1108 of the routes 1106 are tilted with a 45 degree angle to allow for 0.1" dual row headers, and the inner contact points of the through-holes 1104 have surface-mount pads (not shown) that can be used for mounting discrete components such as 0805's capacitors, resistors, inductors, etc. as well as general connecting wires. The bottom side of the board 1100 has pre-designed surface-mount pads (not shown) connected to the ground plane (not shown) that can be used for mounting additional discrete 0805's components. The center-to-center spacing between the through-holes 1104 is 0.1 inch. The same concept can be extended to any board size, e.g., 4 inches by 4 inches, 6 inches by 6 inches, etc.

Figure 12:
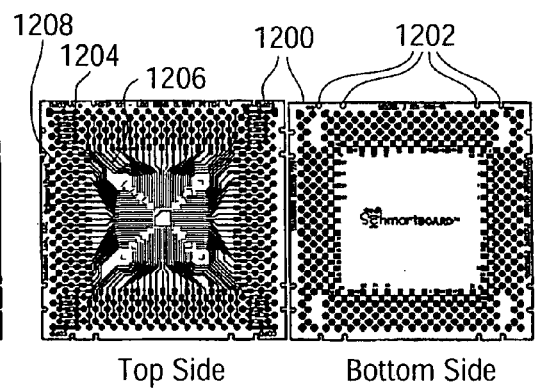
FIG. 12 is a diagram illustrating an Electronic Circuit Building Block with pre-routed traces and pre-configured to hold QFP, TQFP, PQFP package ICs from 32 pins to 100 pins with 0.5 mm pitch surface-mount components, 20 pieces of 0603 package, and some through-hole components, according to one embodiment of the present invention.

FIG. 12 is a diagram illustrating an Electronic Circuit Building Block 1200 with pre-routed traces and pre-configured to hold a QFP, TQFP, PQFP package IC from 32 pins to 100 pins with 0.5 mm pitch surface-mount components, 20 pieces of 0603 package, and some through-hole components, according to one embodiment of the present invention. The board 1200 includes 4 slots 1202 on each edge of the board 1200 to support the scalable feature described in FIGS. 1A–1H. The board also includes through-holes 1204 with 0.1 inch lead spacing to hold through-hole components. The through-hole leads 1204 are arranged with 0.05 inch offset spacing, i.e., the through-holes 1204 in each adjacent row of through-holes 1204 are offset by 0.05 inches.

The pre-routed traces 1206 interconnect the surface-mount components and the through-holes to the outer edges of the board 1200. The board 1200 includes 352 through-holes in 0.038 inch size (diameter). The traces 1206 have widths of 0.008 inch, 0.010 inch, or 0.030 inch. There are 6 ground holes (GND) connected to a copper plane (not shown) on the bottom side of the board 1200. The end-points 1208 of the routes 1206 are tilted with a 45 degree angle to allow for 0.1" dual row headers, and the inner contact points of the through-holes 1204 have surface-mount pads (not shown) that can be used for mounting discrete components such as 0805's capacitors, resistors, inductors, etc. as well as general connecting wires. The bottom side of the board 1200 has pre-designed surface-mount pads (not shown) connected to the ground plane (not shown) that can be used for mounting additional discrete 0805's components. The center-to-center spacing between the through-holes 1204 is 0.1 inch. The same concept can be extended to any board size, e.g., 4 inches by 4 inches, 6 inches by 6 inches, etc.

Figure 13:
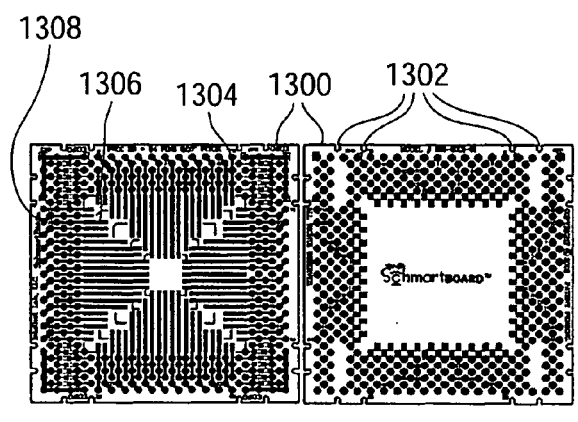
FIG. 13 is a diagram illustrating an Electronic Circuit Building Block with pre-routed traces and pre-configured to hold PLCC ICs from 20 pins to 84 pins with 0.05 mm pitch surface-mount components, 26 pieces of 0603 package, and some through-hole passive components, according to one embodiment of the present invention.

FIG. 13 is a diagram illustrating an Electronic Circuit Building Block 1300 with pre-routed traces and pre-configured to hold a PLCC IC from 20 pins to 84 pins with 0.05 mm pitch surface-mount components, 26 pieces of 0603 package, and some through-hole components, according to one embodiment of the present invention. There are 4 slots 1302 on each edge of the board 1300 to support the scalable feature described in FIGS. 1A–1H. The board 1300 also includes through-holes 1304 with 0.1 inch lead spacing to hold through-hole components. The through-hole leads 1304 are arranged with 0.05 inch offset spacing, i.e., the through-holes 1304 in each adjacent row of through-holes 1304 are offset by 0.05 inches.

The pre-routed traces 1306 interconnect the surface-mount components and the through-holes to the outer edges of the board 1300. The board 1300 includes 348 through-holes in 0.038 inch size (diameter). The traces 1306 have widths of 0.010 inch, 0.020 inch, or 0.030 inch. There are 14 ground holes (GND) connected to a copper plane (not shown) on the bottom side of the board 1300. The end-points 1308 of the routes 1306 are tilted with a 45 degree angle to allow for 0.1" dual row headers, and the inner contact points of the through-holes 1304 are designed with surface-mount pads (not shown) that can be used for mounting discrete components such as 0805's capacitors, resistors, inductors, etc. as well as general connecting wires. The bottom side of the board 1300 has pre-designed surface-mount pads (not shown) connected to the ground plane (not shown) that can be used for mounting additional discrete 0805's components. The center-to-center spacing between the through-holes 1304 is 0.1 inch. The same concept can be extended to any board size, e.g., 4 inches by 4 inches, 6 inches by 6 inches, etc.

Figure 14:
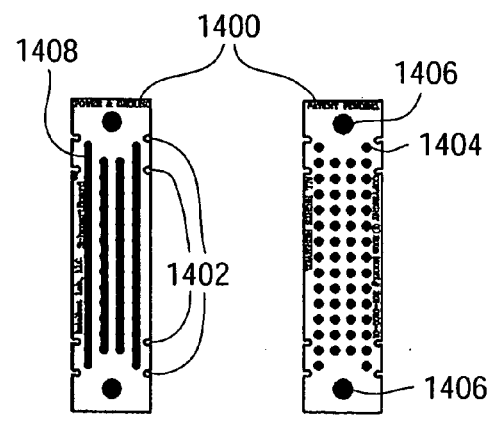
FIG. 14 is a diagram illustrating an Electronic Circuit Building Block with pre-routed traces and pre-configured to hold through-hole power and ground, according to one embodiment of the present invention.

FIG. 14 is a diagram illustrating an Electronic Circuit Building Block 1400 with pre-routed traces 1408 and pre-configured to hold through-hole power and ground, according to one embodiment of the present invention. There are four slots on two edges of the board 1400 to support the scalable feature described in FIGS. 1A–1H. The board 1400 has a size of 0.5 inches×2 inches. The grid board 1400 holds multiple power and ground signals. The board 1400 has 56 through-holes 1404 in 0.038 inch size and 2 mounting holes 1406 in 0.130 inch size. The traces 1408 have widths of 0.050 inch.

Figure 15:
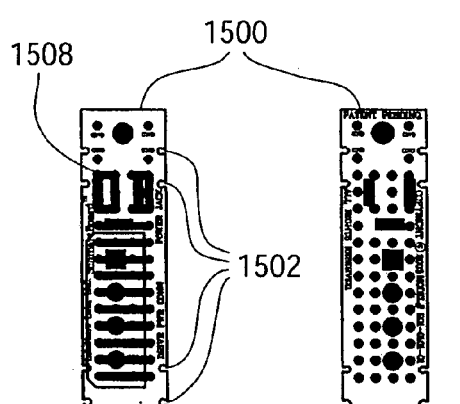
FIG. 15 is a diagram illustrating an Electronic Circuit Building Block with pre-routed traces and pre-configured to hold a through-hole drive power connector and a powerjack, according to one embodiment of the present invention.

FIG. 15 is a diagram illustrating an Electronic Circuit Building Block 1500 with pre-routed traces 1508 and pre-configured to hold a through-hole drive power connector and a power jack, according to one embodiment of the present invention. The size of the board 1500 is 0.5"×2". There are four slots 1502 on two edges of the board 1500 to support the scalable feature described in FIGS. 1A–1H. There are 12 ground through-holes (GND) connected to a copper plane (not shown) on the bottom side. The traces 1508 have widths of 0.050 inch. The board 1500 supports 1 piece of a drive power connector and 1 piece of a power jack.

Figure 16:
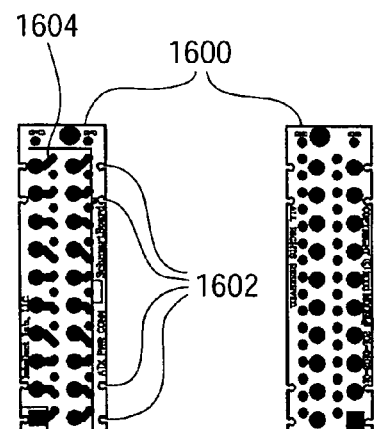
FIG. 16 is a diagram illustrating an Electronic Circuit Building Block with pre-routed traces and pre-configured to hold a through-hole ATX power connector, according to one embodiment of the present invention.

FIG. 16 is a diagram illustrating an Electronic Circuit Building Block 1600 with pre-routed traces 1604 and pre-configured to hold a through-hole ATX power connector, according to one embodiment of the present invention. The size of the board 1600 is 0.5 inches×2 inches. There are four slots 1602 on two edges of the board 1600 to support the scalable feature described in FIGS. 1A–1H. The traces 1604 have widths of 0.050 inch. The board 1600 supports one piece of ATX 20-pin power connector. There are 10 ground holes (GND) connected to a copper plane (not shown) on the bottom side.

Figure 17:
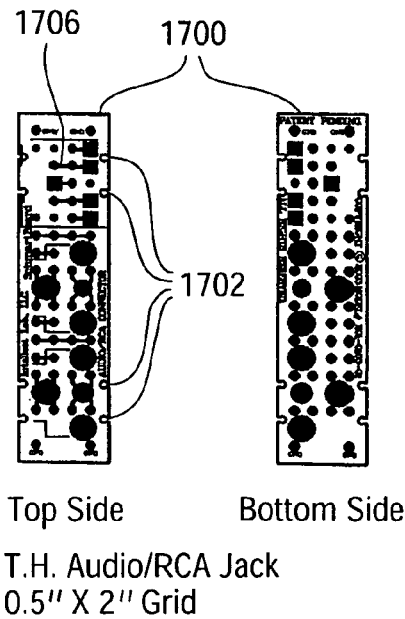
FIG. 17 is a diagram illustrating an Electronic Circuit Building Block with pre-routed traces and pre-configured to hold a through-hole audio RCA jack, according to one embodiment of the present invention.

FIG. 17 is a diagram illustrating an Electronic Circuit Building Block 1700 with pre-routed traces 1706 and pre-configured to hold a through-hole audio RCA jack, according to one embodiment of the present invention. The size of the board 1700 is 0.5 inch by 2 inches. There are four slots 1702 on two edges of the board 1700 to support the scalable feature described in FIGS. 1A–1H. The traces 1706 have widths of 0.020 inch. The board 1700 supports two RCA jacks and one 3.5 mm phone jack. There are four ground holes (GND) connected to a copper plane (not shown) on the bottom side of the board 1700

Figure 18:
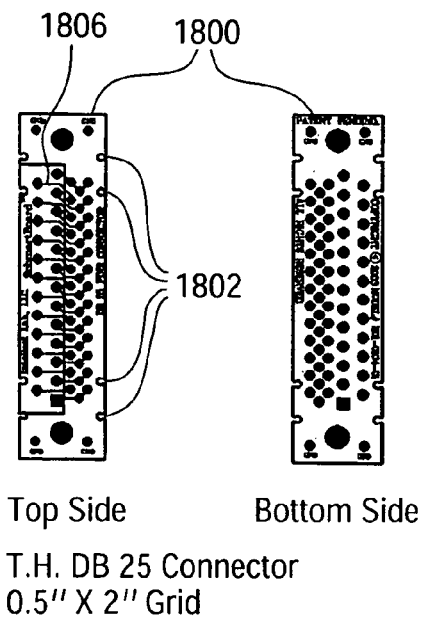
FIG. 18 is a diagram illustrating an Electronic Circuit Building Block with pre-routed traces and pre-configured to hold a through-hole DB 25 connector, according to one embodiment of the present invention.

FIG. 18 is a diagram illustrating an Electronic Circuit Building Block 1800 with pre-routed traces 1806 and pre-configured to hold a through-hole DB 25 connector, according to one embodiment of the present invention. The size of the board 1800 is 0.5 inch by 2 inches. There are 4 slots 1802 on 2 edges of the board 1800 to support the scalable feature described in FIGS. 1A–1H. The traces 1806 have widths of 0.010 inch. The board 1800 supports a DSUB connector from 9 to 25 pins. There are 4 ground holes (GND) connected to a copper plane (not shown) on the bottom side.

Figure 19:
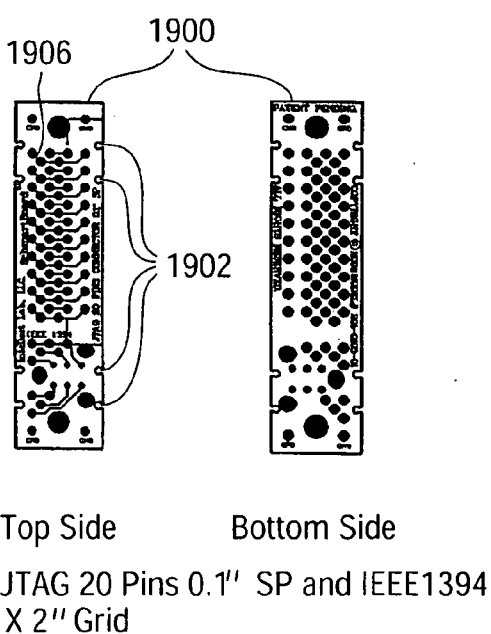
FIG. 19 is a diagram illustrating an Electronic Circuit Building Block with pre-routed traces and pre-configured to hold a through-hole JTAG 20 pins with 0.1" spacing and an IEEE 1394 Firewire connector, according to one embodiment of the present invention.

FIG. 19 is a diagram illustrating an Electronic Circuit Building Block 1900 with pre-routed traces 1906 and pre-configured to hold a through-hole JTAG with 20 pins with 0.1" spacing and an IEEE 1394 Firewire connector, according to one embodiment of the present invention. The size of the board 1900 is 0.5 inch by 2 inches. There are four slots 1902 on two edges of the board 1900 to support the scalable feature described in FIGS. 1A–1H. The traces 1906 have widths of 0.010 inch. The board 1900 supports one JTAG connector of 20 pins and one IEEE 1394 connector. There are four ground holes (GND) connected to a copper plane (not shown) on the bottom side.

Figure 20:
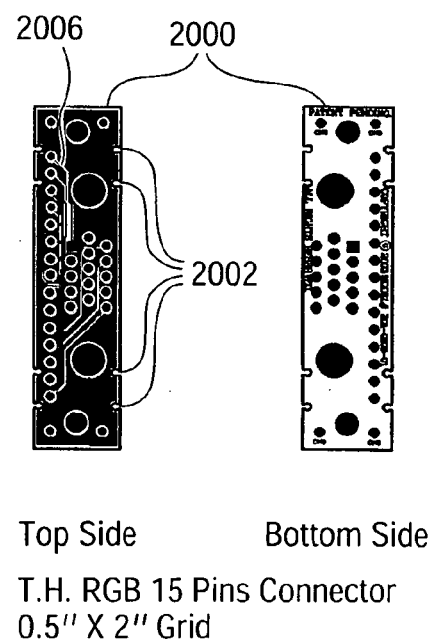
FIG. 20 is a diagram illustrating an Electronic Circuit Building Block with pre-routed traces and pre-configured to hold a through-hole RGB 15-pin connector, according to one embodiment of the present invention.

FIG. 20 is a diagram illustrating an Electronic Circuit Building Block 2000 with pre-routed traces 2006 and pre-configured to hold a through-hole RGB 15-pin connector, according to one embodiment of the present invention. The size of the board 2000 is 0.5 inch by 2 inch. There are four slots 2002 on two edges of the board 2000 to support the scalable feature described in FIGS. 1A–1H. The traces 2006 have widths of 0.010 inch. The board 2000 supports one RGB 15 pin connector. There are 4 ground holes (GND) connected to a copper plane (not shown) on the bottom side.

Figure 21:
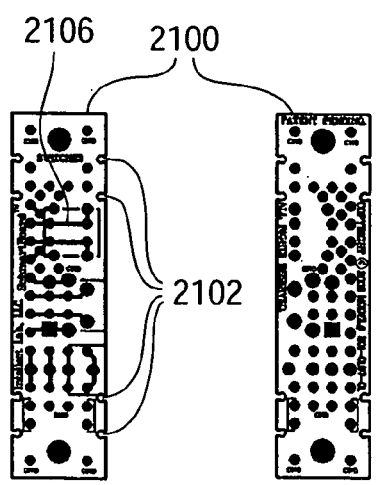
FIG. 21 is a diagram illustrating an Electronic Circuit Building Block with pre-routed traces and pre-configured to hold a through-hole switch, according to one embodiment of the present invention.

FIG. 21 is a diagram illustrating an Electronic Circuit Building Block 2100 with pre-routed traces 2106 and pre-configured to hold a through-hole switch, according to one embodiment of the present invention. The size of the board 2100 is 0.5 inch by 2 inches. There are four slots 2102 on two edges of the board 2100 to support the scalable feature described in FIGS. 1A–1H. The traces 2106 have a width of 0.020 inch. The board 2100 supports 4 different types of switches (two toggle switches and two push button switches). There are 12 ground holes (GND) connected to a copper plane (not shown) on the bottom side.

Figure 22:
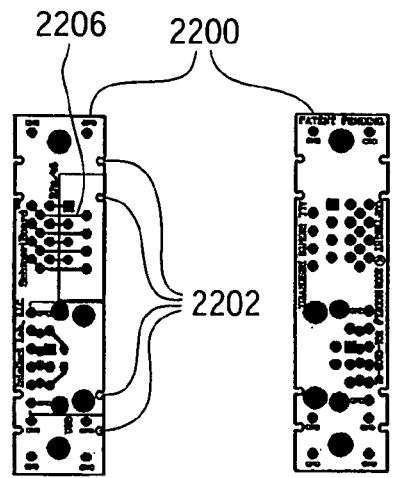
FIG. 22 is a diagram illustrating an Electronic Circuit Building Block with pre-routed traces and pre-configured to hold a through-hole RJ11 or RJ45 connector and a USB connector, according to one embodiment of the present invention.

FIG. 22 is a diagram illustrating an Electronic Circuit Building Block 2200 with pre-routed traces 2206 and pre-configured to hold a through-hole RJ11 or RJ45 connector and a USB connector, according to one embodiment of the present invention. The size of the board 2200 is 0.5 inch by 2 inches. There are four slots 2202 on two edges of the board 2200 to support the scalable feature described in FIGS. 1A–1H. The traces 2206 have widths of 0.010 inch. The board 2200 supports one RJ11 or RJ45 connector and one USB Type B connector. There are 8 ground holes (GND) connected to a copper plane (not shown) on the bottom side.

What is claimed is:

1. A circuit board for mounting circuit components, the circuit board comprising:
    traces of electrically conductive material disposed on at least one side of the circuit board for electrically interconnecting the circuit components mounted on the circuit board; and
    at least one female interlocking element on at least one edge of the circuit board for interlocking with a male interlocking element of a circuit board connector that connects the circuit board with another circuit board, wherein the circuit board is connected to another circuit board by a first half part of the male interlocking element of the circuit board connector inserted into the female interlocking element of the circuit board from one side of the circuit board and a second half part of the male interlocking element of the circuit board connector inserted into a female interlocking element of the another circuit board from one side of the another circuit board, to form a larger circuit board.

2. The circuit board of claim 1, further comprising:
    through-holes disposed on the circuit board for mounting through-hole circuit components on the circuit board, the traces electrically interconnecting two or more of the through-hole circuit components.

3. The circuit board of claim 2, wherein the through-hole circuit component is one selected from the group consisting of a resistor, a capacitor, an inductor, a crystal, a header, a jumper wire, a fuse, a transistor, a voltage regulator, a Dual In-Line package integrated circuit, a Dual In-Line package switch, a relay, an RJ11 connector, an RJ45 connector, a drive power connector, a power jack, an ATX power connector, an audio RCA jack, a DB 25 connector, a JTAG connector, an IEEE 1394 Firewire connector, an RGB connector, and a USB connector.

4. The circuit board of claim 2, wherein the through-holes are disposed in an array, and the through-holes in a first row of the array are positioned with a predetermined offset in relation to the positions of the through-holes in a second row of the array adjacent to the first row.

5. The circuit board of claim 1, further comprising:
    at least one surface-mount pad disposed on one side of the circuit board for mounting a surface-mount circuit component on the circuit board.

6. The circuit board of claim 5, wherein the surface-mount circuit component is one selected from the group consisting of a 6063 package integrated circuit, a 0805 package integrated circuit, a CASE-A package integrated circuit, a CASE-B package integrated circuit, a SOD-123 package integrated circuit, a SOT-23 package integrated circuit, a SOT-223 package integrated circuit, a SO package integrated circuit, a SOP package integrated circuit, a QSOP package integrated circuit, a SSOP package integrated circuit, a TSSOP package integrated circuit, a PSSOP package integrated circuit, a QFP package integrated circuit, a TQFP package integrated circuit, a PQFP package integrated circuit, and PLCC package integrated circuit.

7. The circuit board of claim 1, further comprising:
    at least one surface-mount pad disposed on one side of the circuit board for mounting a surface-mount circuit component on the circuit board; and
    through-holes disposed on the circuit board for mounting through-hole circuit components on the circuit board, the traces electrically interconnecting two or more of the surface-mount circuit component and the through-hole circuit components.

8. The circuit board of claim 7, wherein the traces interconnect the surface-mount circuit component to the outer edges of the circuit board via the through-holes.

9. The circuit board of claim 7, wherein an end of the trace is tilted by 45 degrees.

10. The circuit of claim 1, comprising four female interlocking elements on each edge of the circuit board, the female interlocking elements for interlocking with corresponding male interlocking elements of the circuit board connector.

11. The circuit board of claim 1, wherein a half-part of the male interlocking element of the circuit board connector is inserted into the female interlocking element of the circuit board from one side of the circuit board.

12. The circuit board of claim 1, wherein the female interlocking element has a shape including a substantially straight portion open at the edge of the circuit board and a substantially rounded portion connected to the straight portion.

13. A circuit board connector for connecting a first circuit board with a second circuit board, the first circuit board and the second circuit board for mounting circuit components thereon and having at least a first female interlocking element and a second female interlocking element, respectively, the circuit board connector comprising:
    a body having a cross-section that is rectangular with two parallel edges substantially longer than the other two parallel edges; and
    at least one male interlocking element connected to the body, a first half part of the male interlocking element capable of being inserted into the first female interlocking element and a second half part of the male interlocking element capable of being inserted into the second female interlocking element to mechanically connect the first and second circuit boards.

14. The circuit board connector of claim 13, wherein the first and second half parts of the male interlocking element are capable of being inserted into the first and second female interlocking elements, respectively, from one side of the first and second circuit boards to provide backing support for the mechanically connected first and second circuit boards.

15. The circuit board connector of claim 13, comprising four male interlocking elements connected to the body.

16. The circuit board connector of claim 13, wherein the male interlocking element includes a first substantially rounded portion, a second substantially rounded portion, and a substantially straight portion between the first and second substantially rounded portions, the first half part of the male interlocking element being comprised of the first substantially rounded portion and a first half of the straight portion connected to the first substantially rounded portion, and the second half part of the male interlocking element comprised of the second substantially rounded portion and a second half of the straight portion connected to the second substantially rounded portion.

17. A circuit board connector for connecting a first circuit board with a second circuit board, the first circuit board and the second circuit board for mounting circuit components thereon and having at least a first female interlocking means and a second female interlocking means, respectively, the circuit board connector comprising:
a body means for providing backing support for the connected first circuit board and the second circuit board; and
male interlocking means connected to the body means, a first half part of the male interlocking means capable of being inserted into the first female interlocking means and a second half part of the male interlocking means capable of being inserted into the second female interlocking means to mechanically connect the first and second circuit boards.

18. The circuit board connector of claim 17, wherein the first and second half parts of the male interlocking means are capable of being inserted into the first and second female interlocking means, respectively, from one side of the first and second circuit boards to provide backing support for the connected first and second circuit boards.

19. The circuit board connector of claim 17, comprising four male interlocking means connected to the body means.

20. A method of forming a circuit board using a first circuit board, a second circuit board, and a circuit board connector, the first circuit board having at least a first female interlocking element, the second circuit board having at least a second female interlocking element, and the circuit board connector having at least a male interlocking element, the method comprising:
mounting at least a first circuit component on the first circuit board;
mounting at least a second circuit component on the second circuit board;
inserting a first half part of the male interlocking element into the first female interlocking element; and
inserting a second half part of the male interlocking element into the second female interlocking element to mechanically connect the first and second circuit boards to form the circuit board.

* * * * *